United States Patent
Itasaka et al.

(10) Patent No.: US 11,863,124 B2
(45) Date of Patent: Jan. 2, 2024

(54) CIRCUIT DEVICE AND OSCILLATOR

(71) Applicant: SEIKO EPSON CORPORATION, Tokyo (JP)

(72) Inventors: Yosuke Itasaka, Minowa (JP); Takashi Nomiya, Matsumoto (JP)

(73) Assignee: SEIKO EPSON CORPORATION ( * ) Notice: Subject to any disclaimer, the term of this patent is extended or adjusted under 35 U.S.C. 154(b) by 0 days.

(21) Appl. No.: 17/986,930

(22) Filed: Nov. 15, 2022

(65) Prior Publication Data
US 2023/0155548 A1 May 18, 2023

(30) Foreign Application Priority Data

Nov. 16, 2021 (JP) ................. 2021-186167

(51) Int. Cl.
H03B 5/04 (2006.01)
H03B 5/36 (2006.01)

(52) U.S. Cl.
CPC .............. H03B 5/04 (2013.01); H03B 5/366 (2013.01)

(58) Field of Classification Search
CPC ........... H03B 5/04; H03B 5/366; H03B 5/368
See application file for complete search history.

(56) References Cited

U.S. PATENT DOCUMENTS

2019/0207622 A1* 7/2019 Tanaka .................. H03M 3/474

FOREIGN PATENT DOCUMENTS

JP 2017-112557 A 6/2017

* cited by examiner

Primary Examiner — Jeffrey M Shin
(74) Attorney, Agent, or Firm — Harness, Dickey & Pierce, P.L.C.

(57) ABSTRACT

A circuit device includes: an oscillation circuit configured to oscillate a resonator; a temperature compensation circuit configured to output a temperature compensation voltage for temperature compensating an oscillation frequency of the oscillation circuit, based on a temperature detection result of a temperature sensor; and a frequency control circuit configured to output a frequency control voltage for the oscillation frequency. The oscillation circuit includes a first variable capacitance circuit having a positive capacitance change characteristic with respect to a capacitance control voltage and a second variable capacitance circuit having a negative capacitance change characteristic with respect to the capacitance control voltage. The temperature compensation circuit supplies the temperature compensation voltage as the capacitance control voltage to the first variable capacitance circuit, and the frequency control circuit supplies the frequency control voltage as the capacitance control voltage to the second variable capacitance circuit.

10 Claims, 14 Drawing Sheets

CIRCUIT DEVICE AND OSCILLATOR

The present application is based on, and claims priority from JP Application Serial Number 2021-186167, filed Nov. 16, 2021, the disclosure of which is hereby incorporated by reference herein in its entirety.

BACKGROUND

1. Technical Field

The present disclosure relates to a circuit device, an oscillator and the like.

2. Related Art

In a circuit device that oscillates a resonator such as a quartz crystal resonator, a variable capacitance circuit for adjusting an oscillation frequency is provided. For example, JP-A-2017-112557 discloses a voltage controlled oscillator including an oscillation unit that performs an oscillation operation on a resonator, first and second variable capacitance circuits, first and second temperature compensation voltage generation circuits, and a frequency control voltage generation circuit. In the voltage controlled oscillator, the first temperature compensation voltage generation circuit generates a first temperature compensation voltage for controlling a capacitance of the first variable capacitance circuit, based on a detection signal from a temperature sensor, and the frequency control voltage generation circuit generates a frequency control voltage for controlling a capacitance of the second variable capacitance circuit. The second temperature compensation voltage generation circuit generates a second temperature compensation voltage for correcting a change in temperature compensation amount caused by the frequency control voltage.

However, all the voltage capacitance characteristics of the variable capacitance circuits in the voltage controlled oscillator in JP-A-2017-112557 are positive characteristics. Therefore, it is difficult to achieve both appropriate temperature compensation for the oscillation frequency in a wide temperature range and control of the oscillation frequency by using the frequency control voltage.

SUMMARY

An aspect of the present disclosure relates to a circuit device, the circuit device including: an oscillation circuit configured to oscillate a resonator; a temperature compensation circuit configured to output a temperature compensation voltage for temperature compensating an oscillation frequency of the oscillation circuit, based on a temperature detection result of a temperature sensor; and a frequency control circuit configured to output a frequency control voltage for the oscillation frequency. The oscillation circuit includes a first variable capacitance circuit whose capacitance change characteristic with respect to a capacitance control voltage is a positive characteristic, and a second variable capacitance circuit whose capacitance change characteristic with respect to the capacitance control voltage is a negative characteristic. The temperature compensation circuit supplies the temperature compensation voltage as the capacitance control voltage to the first variable capacitance circuit, and the frequency control circuit supplies the frequency control voltage as the capacitance control voltage to the second variable capacitance circuit.

Another aspect of the present disclosure relates to an oscillator, the oscillator including: a resonator; and a circuit device. The circuit device includes an oscillation circuit configured to oscillate the resonator, a temperature compensation circuit configured to output a temperature compensation voltage for temperature compensating an oscillation frequency of the oscillation circuit, based on a temperature detection result of a temperature sensor, and a frequency control circuit configured to output a frequency control voltage for the oscillation frequency. The oscillation circuit includes a first variable capacitance circuit whose capacitance change characteristic with respect to a capacitance control voltage is a positive characteristic, and a second variable capacitance circuit whose capacitance change characteristic with respect to the capacitance control voltage is a negative characteristic. The temperature compensation circuit supplies the temperature compensation voltage as the capacitance control voltage to the first variable capacitance circuit, and the frequency control circuit supplies the frequency control voltage as the capacitance control voltage to the second variable capacitance circuit.

DESCRIPTION OF EXEMPLARY EMBODIMENTS

Hereinafter, the present embodiment will be described. The present embodiment to be described below does not unduly limit contents described in the claims. All configurations described in the present embodiment are not necessarily essential constituent elements.

1. Circuit Device

Figure 1:
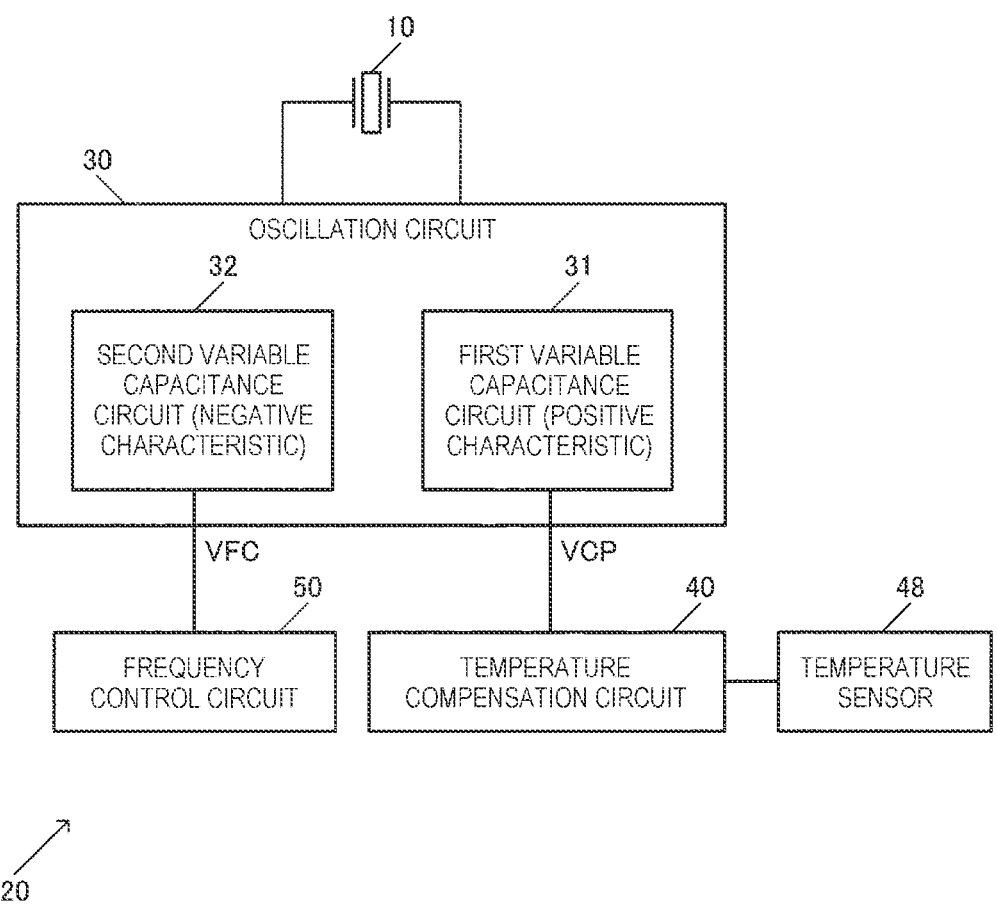
FIG. 1 is a diagram illustrating a configuration example of a circuit device and an oscillator according to the present embodiment.

FIG. 1 is a diagram illustrating a configuration example of a circuit device 20 according to the present embodiment. The circuit device 20 according to the present embodiment includes an oscillation circuit 30, a temperature compensation circuit 40, and a frequency control circuit 50. An oscillator 4 according to the present embodiment includes a resonator 10 and the circuit device 20. The resonator 10 is electrically coupled to the circuit device 20.

The resonator 10 is an element that generates mechanical oscillation according to an electrical signal. The resonator 10 can be implemented by, for example, a resonator element such as a quartz crystal resonator element. For example, the resonator 10 can be implemented by a quartz crystal resonator element that has a cut angle of AT cut, SC cut, or the like and that performs thickness-shear oscillation, a tuning fork type quartz crystal resonator element, or a double-tuning fork type quartz crystal resonator element. For example, the resonator 10 may be a resonator built in a temperature compensated crystal oscillator (TCXO) not provided with an oven, or may be a resonator built in an oven controlled crystal oscillator (OCXO) provided with an oven. The vibrator 10 according to the present embodiment can be implemented by various resonator elements such as a resonator element other than a thickness-shear oscillating type, a tuning fork type, or a double-tuning fork type, and a piezoelectric resonator element formed of a material other than quartz crystal. For example, a surface acoustic wave (SAW) resonator, or a micro electro mechanical systems (MEMS) resonator as a silicon resonator formed using a silicon substrate may be employed as the resonator 10.

The circuit device 20 is an integrated circuit device called an integrated circuit (IC). For example, the circuit device 20 is an IC manufactured by a semiconductor process, and is a semiconductor chip in which a circuit element is formed on a semiconductor substrate. In FIG. 1, the circuit device 20 includes the oscillation circuit 30, the temperature compensation circuit 40, and the frequency control circuit 50, and may also include a temperature sensor 48. The oscillation circuit 30 includes a first variable capacitance circuit 31 and a second variable capacitance circuit 32.

The oscillation circuit 30 is a circuit that oscillates the resonator 10. For example, the oscillation circuit 30 oscillates the resonator 10 to generate an oscillation signal. The oscillation signal is an oscillation clock signal. For example, the oscillation circuit 30 can be implemented by an oscillation drive circuit electrically coupled to one end and the other end of the resonator 10, and a passive element such as a capacitor and a resistor. The drive circuit can be implemented by, for example, a CMOS inverter circuit or a bipolar transistor. The drive circuit is a core circuit of the oscillation circuit 30, and the drive circuit oscillates the resonator 10 by driving the resonator 10 with a voltage or a current. As the oscillation circuit 30, various types of oscillation circuits such as an inverter type, a Pierce type, a Colpitts type, and a Hartley type can be used. Note that coupling in the present embodiment is electrical coupling. The electrical coupling is coupling in which electrical signals can be transmitted, and is coupling in which information can be transmitted by the electrical signals. The electrical coupling may be coupling established via a passive element or the like.

The oscillation circuit 30 includes the first variable capacitance circuit 31 and the second variable capacitance circuit 32. The first variable capacitance circuit 31 and the second variable capacitance circuit 32 are, for example, circuits that change a capacitance formed at least at one of one end and the other end of the resonator 10, and an oscillation frequency of the oscillation circuit 30 can be adjusted by adjusting capacitances of the first variable capacitance circuit 31 and the second variable capacitance circuit 32. The first variable capacitance circuit 31 and the second variable capacitance circuit 32 can be implemented by a variable capacitance element such as a varactor. For example, each of the first variable capacitance circuit 31 and the second variable capacitance circuit 32 includes at least one variable capacitance element.

The temperature compensation circuit 40 is a circuit that performs temperature compensation for the oscillation frequency of the oscillation circuit 30. For example, the temperature compensation circuit 40 outputs a temperature compensation voltage VCP for temperature compensating the oscillation frequency of the oscillation circuit 30, based on a temperature detection result of the temperature sensor 48. The temperature detection result is a temperature detection signal, for example, a temperature detection voltage. The temperature compensation is, for example, processing of performing compensation by reducing a fluctuation in oscillation frequency caused by a temperature fluctuation. That is, the temperature compensation circuit 40 performs temperature compensation for the oscillation frequency of the oscillation circuit 30 such that the oscillation frequency is constant even when a temperature fluctuation occurs.

The temperature sensor 48 is a sensor that detects a temperature. Specifically, the temperature sensor 48 outputs, as a temperature detection voltage, a temperature dependent voltage that changes in accordance with an environmental temperature. For example, the temperature sensor 48 generates a temperature detection voltage, which is a temperature detection signal, by using a circuit element having temperature dependency. Specifically, the temperature sensor 48 outputs the temperature detection voltage, which changes depending on the temperature by using, for example, temperature dependence of a forward voltage of a PN junction. Although the temperature sensor 48 is provided in the circuit device 20 in FIG. 1, a modification may be made in which the temperature sensor 48 is provided outside the circuit device 20 and the temperature compensation circuit 40 performs temperature compensation based on a temperature detection signal such as a temperature detection voltage input from the outside. A modification in which a digital temperature sensor circuit is used as the temperature sensor 48 is also possible. In this case, the temperature detection voltage may be generated by performing D/A conversion on temperature detection data.

The frequency control circuit 50 is a circuit that controls the oscillation frequency of the oscillation circuit 30. Specifically, the frequency control circuit 50 outputs a frequency control voltage VFC for the oscillation frequency. For example, the frequency control circuit 50 generates the frequency control voltage VFC based on a control voltage input from the outside, and outputs the generated frequency control voltage VFC. Alternatively, the frequency control circuit 50 may generate the frequency control voltage VFC based on a control voltage obtained by performing D/A conversion on control data input from the outside. By providing such a frequency control circuit 50, it is possible to implement control of setting the oscillation frequency of the oscillation circuit 30 to a desired frequency. For example, by providing the temperature compensation circuit 40 and the frequency control circuit 50, it is possible to set the oscillation frequency to a desired frequency according to the control voltage and the control data input from the outside while performing temperature compensation for the oscillation frequency.

The oscillation circuit 30 includes the first variable capacitance circuit 31 whose capacitance change characteristic with respect to the capacitance control voltage is a positive characteristic, and the second variable capacitance circuit 32 whose capacitance change characteristic with respect to the capacitance control voltage is a negative characteristic. For example, the first variable capacitance circuit 31 and the second variable capacitance circuit 32 have different polarities of capacitance change characteristic with respect to the capacitance control voltage, that is, one has a positive capacitance change characteristic and the other has a negative capacitance change characteristic. The positive capacitance change characteristic refers to, for example, a change characteristic that the capacitance increases as the capacitance control voltage increases, as will be described later with reference to FIG. 3. The negative capacitance change characteristic refers to, for example, a change characteristic that the capacitance decreases as the capacitance control voltage increases, as will be described later with reference to FIG. 4. The capacitance can also be referred to as a capacitance value.

In the present embodiment, as illustrated in FIG. 1, the temperature compensation circuit 40 supplies the temperature compensation voltage VCP as a capacitance control voltage to the first variable capacitance circuit 31. The frequency control circuit 50 supplies the frequency control voltage VFC as a capacitance control voltage to the second variable capacitance circuit 32. Since the first variable capacitance circuit 31 is a variable capacitance circuit having a positive characteristic, the capacitance of the first variable capacitance circuit 31 increases when the temperature compensation voltage VCP from the temperature compensation circuit 40 increases, and the capacitance of the first variable capacitance circuit 31 decreases when the temperature compensation voltage VCP decreases. Since the second variable capacitance circuit 32 is a variable capacitance circuit having a negative characteristic, the capacitance of the second variable capacitance circuit 32 decreases when the frequency control voltage VFC from the frequency control circuit 50 increases, and the capacitance of the second variable capacitance circuit 32 increases when the frequency control voltage VFC decreases. In this way, by providing the oscillation circuit 30 with the first variable capacitance circuit 31 having a positive characteristic to which the temperature compensation voltage VCP from the temperature compensation circuit 40 is supplied as the capacitance control voltage, for example, when the temperature rises, the capacitance of the first variable capacitance circuit 31 increases, and the oscillation frequency of the oscillation circuit 30 decreases. Accordingly, for example, in a high temperature range, when the oscillation frequency of the resonator 10 increases, since the capacitance of the first variable capacitance circuit 31 increases, it is possible to implement temperature compensation that cancels the increase in the oscillation frequency. By providing the first variable capacitance circuit 31 having a positive characteristic in the oscillation circuit 30, for example, an amplifier circuit for a class A operation can be used as an output amplifier of the temperature compensation voltage VCP of the temperature compensation circuit 40. Therefore, as compared with a case where an amplifier circuit for a class AB operation is provided as an output amplifier, it is possible to perform appropriate temperature compensation for the oscillation frequency in a wide temperature range while achieving a reduction in circuit scale. In addition, by providing the oscillation circuit 30 with the second variable capacitance circuit 32 having a negative characteristic to which the frequency control voltage VFC from the frequency control circuit 50 is supplied as the capacitance control voltage, when the frequency control voltage VFC increases, the capacitance of the second variable capacitance circuit 32 decreases, and the oscillation frequency of the oscillation circuit 30 increases. Therefore, the oscillation frequency can be variably controlled by using the frequency control voltage VFC. As a result, it is possible to implement control of the oscillation frequency based on the frequency control voltage VFC while implementing appropriate temperature compensation for the oscillation frequency in a wide temperature range by the temperature compensation circuit 40. For example, since the frequency control circuit 50 does not necessarily need to be provided with an amplifier circuit, a reduction in circuit scale can be achieved.

Figure 2:
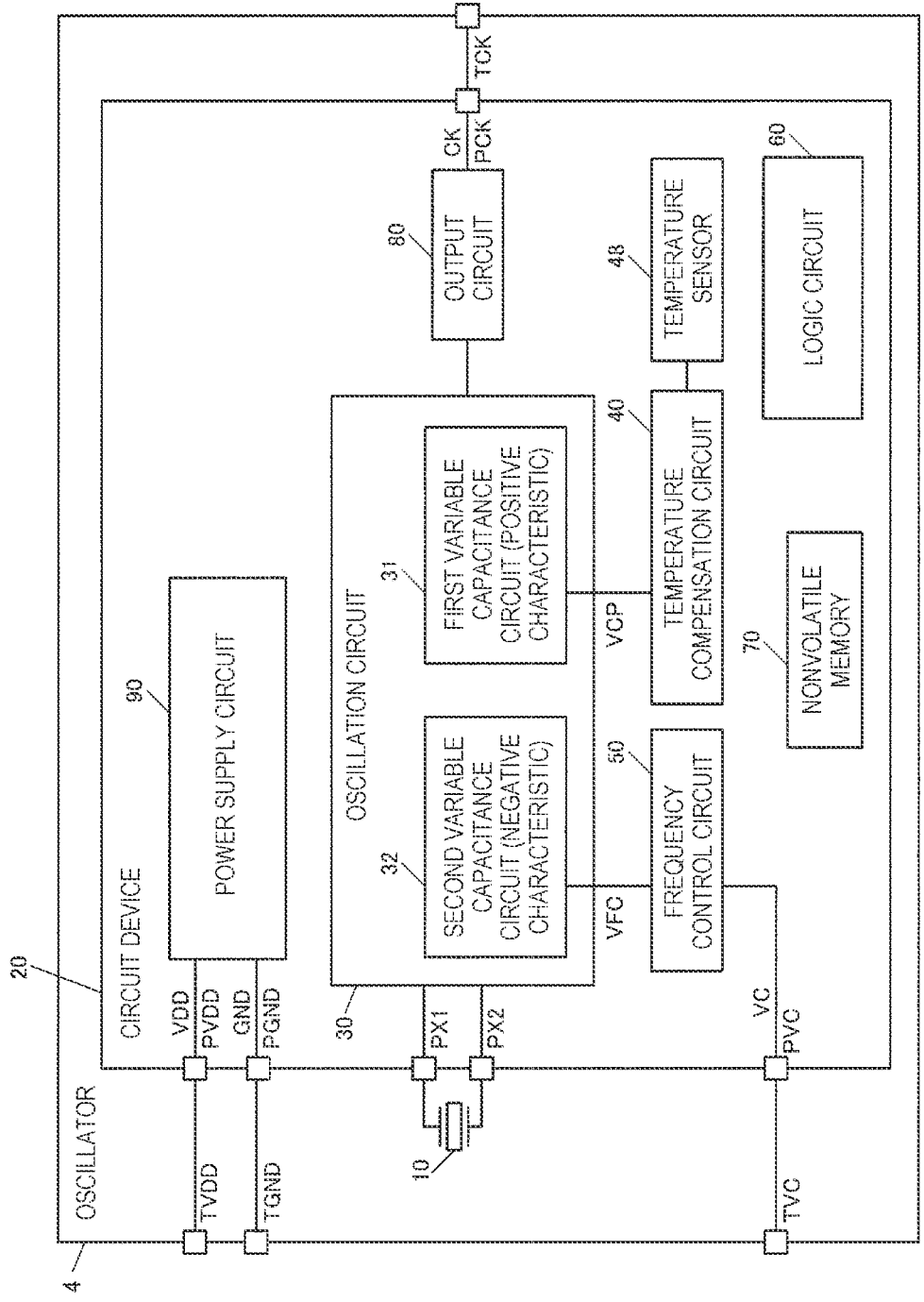
FIG. 2 is a diagram illustrating a detailed configuration example of the circuit device and the oscillator according to the present embodiment.

FIG. 2 is a diagram illustrating a detailed configuration example of the circuit device 20 and the oscillator 4 according to the present embodiment. In FIG. 2, the circuit device 20 includes the oscillation circuit 30, the temperature compensation circuit 40, the temperature sensor 48, the frequency control circuit 50, a logic circuit 60, a nonvolatile memory 70, an output circuit 80, and a power supply circuit 90. The oscillator 4 includes the resonator 10 and the circuit device 20. The resonator 10 is electrically coupled to the circuit device 20. For example, the resonator 10 is electrically coupled to the circuit device 20 by using an internal wiring of a package that accommodates the resonator 10 and the circuit device 20, a bonding wire, or a metal bump. The circuit device 20 and the oscillator 4 are not limited to the configuration in FIG. 2, and various modifications such as omitting some of the components, adding other components, and replacing some of the components with other components can be made.

The circuit device 20 includes pads PVDD, PGND, PX1, PX2, PVC, and PCK. The pad is a terminal of the circuit device 20 that is a semiconductor chip. For example, in a pad region, a metal layer is exposed from a passivation film that is an insulating layer, and the exposed metal layer forms the pad that is a terminal of the circuit device 20. The pads PVDD and PGND are a power supply pad and a ground pad, respectively. A power supply voltage VDD from an external power supply device is supplied to the pad PVDD. The pad PGND is a pad to which GND, which is a ground voltage, is supplied. GND may be referred to as VSS, and the ground voltage is, for example, a ground potential. In the present embodiment, the ground voltage is appropriately described as GND. For example, VDD corresponds to a high potential side power supply, and GND corresponds to a low potential side power supply. The pads PX1 and PX2 are pads for coupling to the resonator 10. The pad PVC is a pad for inputting a control voltage VC, and the pad PCK is a pad for outputting a clock signal CK. The pads PVDD, PGND, PVC, and PCK are electrically coupled to terminals TVDD, TGND, TVC, and TCK, respectively, which are external terminals for external coupling to the oscillator 4. For example, each pad is electrically coupled to a corresponding terminal using an internal wiring of a package, a bonding wire, or a metal bump.

The oscillation circuit 30 is electrically coupled to the resonator 10 via the pads PX1 and PX2. The pads PX1 and PX2 are pads for coupling to the resonator. The oscillation drive circuit of the oscillation circuit 30 is provided between the pad PX1 and the pad PX2. The oscillation circuit 30 includes the first variable capacitance circuit 31 and the second variable capacitance circuit 32. Since the first variable capacitance circuit 31 and the second variable capacitance circuit 32 are electrically coupled to at least one of the pads PX1 and PX2, a load capacitance of the oscillation circuit 30 can be variably adjusted.

The temperature compensation circuit 40 performs analog temperature compensation according to polynomial approximation, for example. For example, when the temperature compensation voltage VCP for compensating a frequency-temperature characteristic of the resonator 10 is approximated by using a polynomial, the temperature compensation circuit 40 performs the analog temperature compensation based on coefficient information of the polynomial. The analog temperature compensation is, for example, temperature compensation implemented by addition processing of a current signal or a voltage signal that is an analog signal. For example, when the temperature compensation voltage VCP is approximated by using a high-order polynomial, a zero-order coefficient, a linear coefficient, and a high-order coefficient of the polynomial are stored in a storage unit implemented by, for example, the nonvolatile memory 70 as zero-order correction data, linear correction data, and high-order correction data, respectively. The high-order coefficient is, for example, a coefficient of an order higher than the first order, and the high-order correction data is correction data corresponding to the high-order coefficient. For example, when the temperature compensation voltage VCP is approximated by using a cubic polynomial, a zero-order coefficient, a linear coefficient, a quadratic coefficient, and a cubic coefficient of the polynomial are stored in the storage unit as zero-order correction data, linear correction data, quadratic correction data, and cubic correction data. Then, the temperature compensation circuit 40 performs temperature compensation based on the zero-order correction data to the cubic correction data. In this case, the quadratic correction data and temperature compensation based on the quadratic correction data may be omitted. For example, when the temperature compensation voltage VCP is approximated by using a quintic polynomial, a zero-order coefficient, a linear coefficient, a quadratic coefficient, a cubic coefficient, a quartic coefficient, and a quintic coefficient of the polynomial are stored in the storage unit as zero-order correction data, linear correction data, quadratic correction data, cubic correction data, quartic correction data, and quintic correction data. Then, the temperature compensation circuit 40 performs temperature compensation based on the zero-order correction data to the quintic correction data. In this case, the quadratic correction data or the quartic correction data, and the temperature compensation based on the quadratic correction data or the quartic correction data may be omitted. The order of polynomial approximation is any, and for example, polynomial approximation of an order higher than the fifth order may be performed. The zero-order correction may be performed by the temperature sensor 48.

A control voltage VC from the outside is input to the frequency control circuit 50. For example, the control voltage VC from an external system implemented by a microcomputer or various ICs is input to the frequency control circuit 50 via the terminal TVC and the pad PVC. As an example, the oscillation circuit 30 of the circuit device 20 functions as a voltage controlled oscillator, and a feedback loop of PLL is formed by an external system. The frequency control circuit 50 outputs the frequency control voltage VFC corresponding to the control voltage VC from the outside. For example, the frequency control circuit 50 outputs the frequency control voltage VFC obtained by gain-adjusting the control voltage VC. Digital control data may be input to the circuit device 20 via an interface circuit (not illustrated), and the control voltage VC obtained by D/A converting the digital control data may be input to the frequency control circuit 50.

The logic circuit 60 is a control circuit and performs various types of control processing. For example, the logic circuit 60 controls the entire circuit device 20 or controls an operation sequence of the circuit device 20. The logic circuit 60 performs various types of processing for controlling the oscillation circuit 30, controls the temperature sensor 48, the output circuit 80, or the power supply circuit 90, or controls reading and writing of information from and to the nonvolatile memory 70. The logic circuit 60 can be implemented by, for example, an application specific integrated circuit (ASIC) using automatic placement and routing such as a gate array.

The nonvolatile memory 70 is a memory that stores information even without power supply. For example, the nonvolatile memory 70 is a memory that can store information without power supply and in which information can be rewritten. The nonvolatile memory 70 stores various kinds of information necessary for operations of the circuit device 20 and the like. The nonvolatile memory 70 can be implemented by an electrically erasable programmable read-only memory (EEPROM) or the like that is implemented by a floating gate avalanche injection MOS memory (FAMOS memory) or a metal-oxide-nitride-oxide-silicon memory (MONOS memory). The nonvolatile memory 70 stores correction data such as linear correction data and high-order correction data used for temperature compensation of the temperature compensation circuit 40.

The output circuit 80 outputs the clock signal CK based on an oscillation signal from the oscillation circuit 30. For example, the output circuit 80 buffers an oscillation signal, which is an oscillation clock signal from the oscillation circuit 30, and outputs the buffered oscillation signal as the clock signal CK to the pad PCK. The clock signal CK is output to the outside via the clock output terminal TCK of the oscillator 4. For example, the output circuit 80 outputs the clock signal CK in a single-ended CMOS signal format. The output circuit 80 may output the clock signal CK in a signal format other than the CMOS signal format. In addition, a clock signal generation circuit such as a PLL circuit that generates a clock signal CK having a frequency obtained by multiplying a frequency of an oscillation signal may be provided at a subsequent stage of the oscillation circuit 30, and the output circuit 80 may buffer the clock signal CK generated by the clock signal generation circuit and output the buffered clock signal CK.

The power supply circuit 90 is supplied with the power supply voltage VDD from the pad PVDD and the ground voltage GND from the pad PGND, and supplies various power supply voltages for an internal circuit in the circuit device 20 to the internal circuit. For example, the power supply circuit 90 supplies a regulated power supply voltage obtained by regulating the power supply voltage VDD to circuits in the circuit device 20, such as the oscillation circuit 30.

Figure 3:
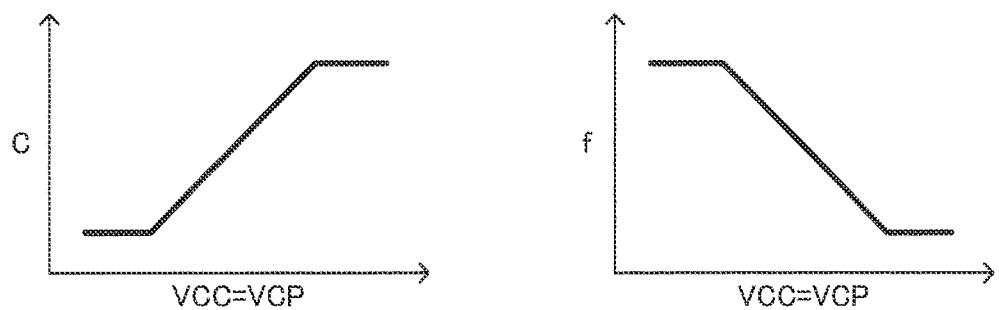
FIG. 3 is a graph illustrating a positive voltage capacitance characteristic of a first variable capacitance circuit.
Figure 4:
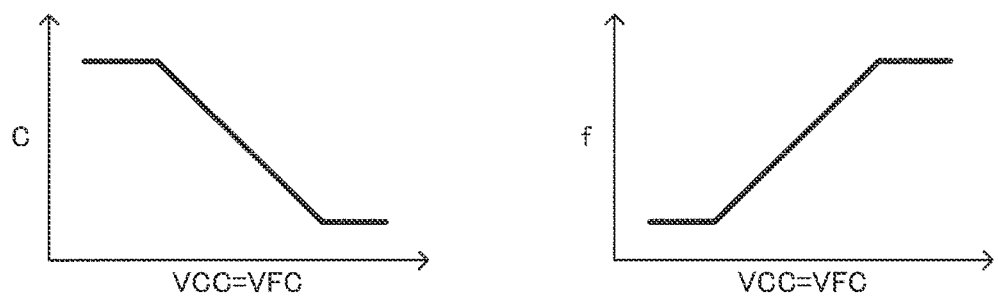
FIG. 4 is a graph illustrating a negative voltage capacitance characteristic of a second variable capacitance circuit.

FIG. 3 is a graph illustrating a positive voltage capacitance characteristic of the first variable capacitance circuit 31. FIG. 4 is a graph illustrating a negative voltage capacitance characteristic of the second variable capacitance circuit 32. The voltage capacitance characteristic is a characteristic of a capacitance C with respect to a capacitance control voltage VCC. Note that FIGS. 3 and 4 schematically illustrate the voltage capacitance characteristic, and actually, the voltage capacitance characteristic is not a linear characteristic as illustrated in FIGS. 3 and 4, but a characteristic having an inflection point at which an inclination is maximum in the vicinity of a center of a change range.

As illustrated in FIG. 3, the temperature compensation voltage VCP is input as the capacitance control voltage VCC to the first variable capacitance circuit 31. According to the positive voltage capacitance characteristic of the first variable capacitance circuit 31, when the temperature compensation voltage VCP increases, the capacitance C increases, and accordingly an oscillation frequency f of the oscillation circuit 30 decreases. On the other hand, as illustrated in FIG. 4, the frequency control voltage VFC is input as the capacitance control voltage VCC to the second variable capacitance circuit 32. According to the negative voltage capacitance characteristic of the second variable capacitance circuit 32, when the frequency control voltage VFC increases, the capacitance C decreases, and accordingly the oscillation frequency f increases.

Figure 5:
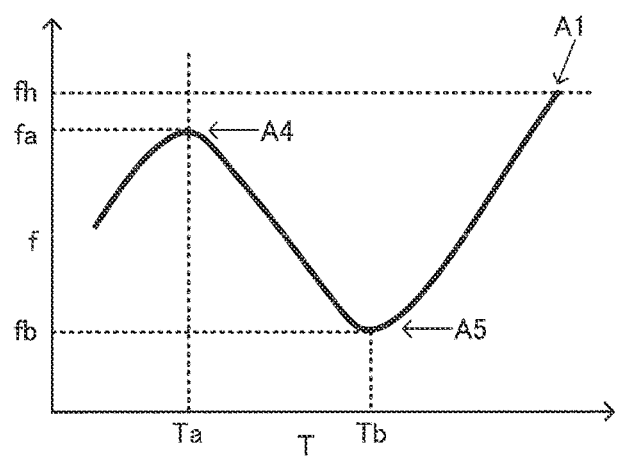
FIG. 5 is a graph illustrating an example of a frequency-temperature characteristic of a resonator.
Figure 6:
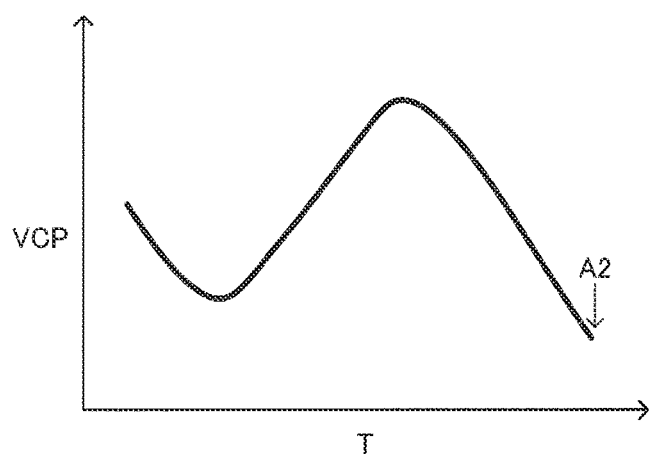
FIG. 6 is a graph illustrating an example of a temperature characteristic of a temperature compensation voltage in a case where the second variable capacitance circuit having a negative characteristic is used.

FIG. 5 is a graph illustrating a frequency-temperature characteristic of the resonator 10. Specifically, the frequency-temperature characteristic is a frequency-temperature characteristic of the AT-cut quartz crystal resonator 10, for example. As illustrated in FIG. 5, the resonator 10 has a frequency-temperature characteristic approximated by using a cubic curve. When the capacitance is to be adjusted with respect to the resonator 10 by using the second variable capacitance circuit 32 having a negative voltage capacitance characteristic, the temperature compensation circuit 40 needs to output the temperature compensation voltage VCP having a temperature characteristic as illustrated in FIG. 6, for example. In this way, when the oscillation frequency of the resonator 10 increases in a high temperature range as indicated by A1 in FIG. 5, the temperature compensation voltage VCP output from the temperature compensation circuit 40 decreases as indicated by A2 in FIG. 6. Accordingly, the capacitance of the second variable capacitance circuit 32 having a negative characteristic increases, and the increase in the oscillation frequency of the resonator 10 is canceled out, whereby temperature compensation for maintaining the oscillation frequency constant can be implemented.

However, in order to sufficiently decrease the temperature compensation voltage VCP in a high temperature range indicated by A2 in FIG. 6, it is necessary to widen a low-voltage-side operation range of an output amplifier of the temperature compensation circuit 40. Therefore, in an amplifier circuit for a class A operation illustrated in FIG. 17 to be described later that serves as the output amplifier of the temperature compensation circuit 40, it is difficult to widen the low-voltage-side operation range, and it is necessary to use an amplifier circuit for a class AB operation illustrated in FIG. 18 to be described later, which complicates the circuit and increases the circuit scale.

Figure 7:
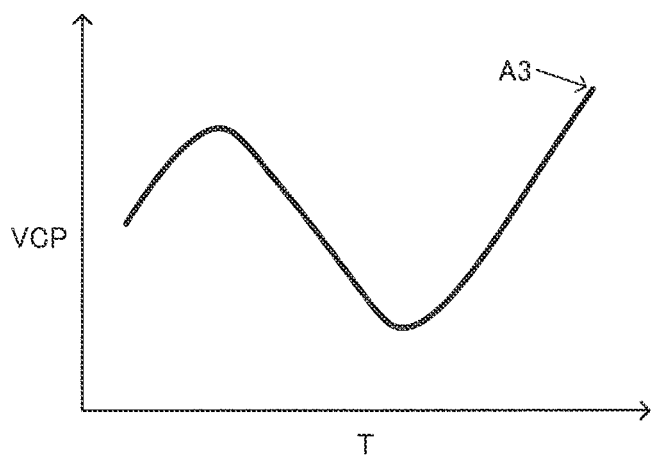
FIG. 7 is a graph illustrating an example of the temperature characteristic of the temperature compensation voltage in a case where the first variable capacitance circuit having a positive characteristic is used.

On the other hand, when the capacitance is to be adjusted with respect to the resonator 10 by using the first variable capacitance circuit 31 having a positive voltage capacitance characteristic, the temperature compensation circuit 40 may output the temperature compensation voltage VCP having a temperature characteristic as illustrated in FIG. 7, for example. In this way, when the oscillation frequency of the resonator 10 increases in the high temperature range as indicated by A1 in FIG. 5, the temperature compensation voltage VCP output from the temperature compensation circuit 40 increases as indicated by A3 in FIG. 7. Accordingly, the capacitance of the second variable capacitance circuit 31 having a positive characteristic increases, and the increase in the oscillation frequency of the resonator 10 is canceled out, whereby temperature compensation for maintaining the oscillation frequency constant can be implemented.

In this case, in the high temperature range indicated by A3 in FIG. 7, in order to output a high temperature compensation voltage VCP from the temperature compensation circuit 40, it is necessary to widen a high-voltage-side operation range of the output amplifier. In this regard, even in the amplifier circuit for a class A operation illustrated in FIG. 17 to be described later, since a P-type drive transistor constituting an output part is sufficiently turned on, the high temperature compensation voltage VCP as indicated by A3 in FIG. 7 can also be appropriately output. Therefore, it is not essential to use the amplifier circuit for a class AB operation as illustrated in FIG. 18 as the output amplifier of the temperature compensation circuit 40, and it is possible to achieve a reduction in scale and simplification of the circuit.

As described above, the temperature compensation circuit 40 according to the present embodiment can include an amplifier circuit for a class A operation that outputs the temperature compensation voltage VCP. The amplifier circuit for a class A operation is an amplifier circuit including, for example, a differential part having a differential input and an output part coupled to the differential part, and the output part includes a P-type drive transistor and a transistor for current source that are coupled in series between a high potential side power supply node and a low potential side power supply node. In this way, appropriate temperature compensation for the oscillation frequency in a wide temperature range can be implemented by the temperature compensation circuit 40 including the amplifier circuit for a class A operation, which has a smaller circuit scale and a simpler configuration as compared with the amplifier circuit for a class AB operation, and it is possible to achieve both appropriate temperature compensation and a reduction in circuit scale.

For example, the resonator 10 has a frequency-temperature characteristic approximated by using a cubic curve as illustrated in FIG. 5. For example, the resonator 10 has a frequency-temperature characteristic approximated by using a polynomial such as a cubic polynomial. The resonator 10 is a resonator in which, in a state where temperature compensation is not performed as illustrated in FIG. 5, an oscillation frequency fh at an upper limit of an operating temperature range indicated by A1 is larger than a local maximum value fa of the oscillation frequency indicated by A4. The operating temperature range is a temperature range in which specification characteristics can be satisfied in the oscillator 4 and the circuit device 20.

For example, according to the cubic frequency-temperature characteristic of the resonator 10 illustrated in FIG. 5, the oscillation frequency has the local maximum value fa at a temperature Ta as indicated by A4, and the oscillation frequency has a local minimum value fb at a temperature Tb as indicated by A5. The cubic frequency-temperature characteristic of the resonator 10 has an inflection point in the vicinity of, for example, 25° C. between the temperature Ta and the temperature Tb. Therefore, of the operating temperature range, a temperature range on the high temperature side is wider than a temperature range on the low temperature side. For example, when the operating temperature range is −40° C. to 125° C., the temperature range on the high temperature side is 25° C. to 125° C., which is wider than a range of −40° C. to 25° C. that is the temperature range on the low temperature side. The same applies to a case where the operating temperature range is −40° C. to 100° C. The oscillation frequency fh indicated by A1 in FIG. 5 is an oscillation frequency at the upper limit of the operating temperature range, and is, for example, an oscillation frequency at the upper limit in a range of 100° C. to 125° C. Therefore, in FIG. 5, a relationship that the oscillation frequency fh at the upper limit of the operating temperature range is larger than the local maximum value fa of the oscillation frequency is established. In this way, in the resonator 10 in which the oscillation frequency fh at the upper limit of the operating temperature range is larger than the local maximum value fa of the oscillation frequency, the temperature range on the high temperature side is wider than the temperature range on the low temperature side.

Therefore, when the second variable capacitance circuit 32 having a negative characteristic is used as a variable capacitance circuit to which the temperature compensation voltage VCP is input, in order to sufficiently decrease the temperature compensation voltage VCP at the upper limit of the operating temperature range as indicated by A2 in FIG. 6, it is necessary to widen the low-voltage-side operation range of the output amplifier of the temperature compensation circuit 40, and an amplifier circuit for a class AB operation is necessary. In contrast, in the present embodiment, the first variable capacitance circuit 31 having a positive characteristic is used as the variable capacitance circuit to which the temperature compensation voltage VCP is input. Therefore, even when an amplifier circuit for a class A operation is used as the output amplifier of the temperature compensation circuit 40, the temperature compensation voltage VCP can be sufficiently increased at the upper limit of the operating temperature range as indicated by A3 in FIG. 7, and it is possible to achieve both appropriate temperature compensation and a reduction in circuit scale.

2. Oscillation Circuit

Figure 8:
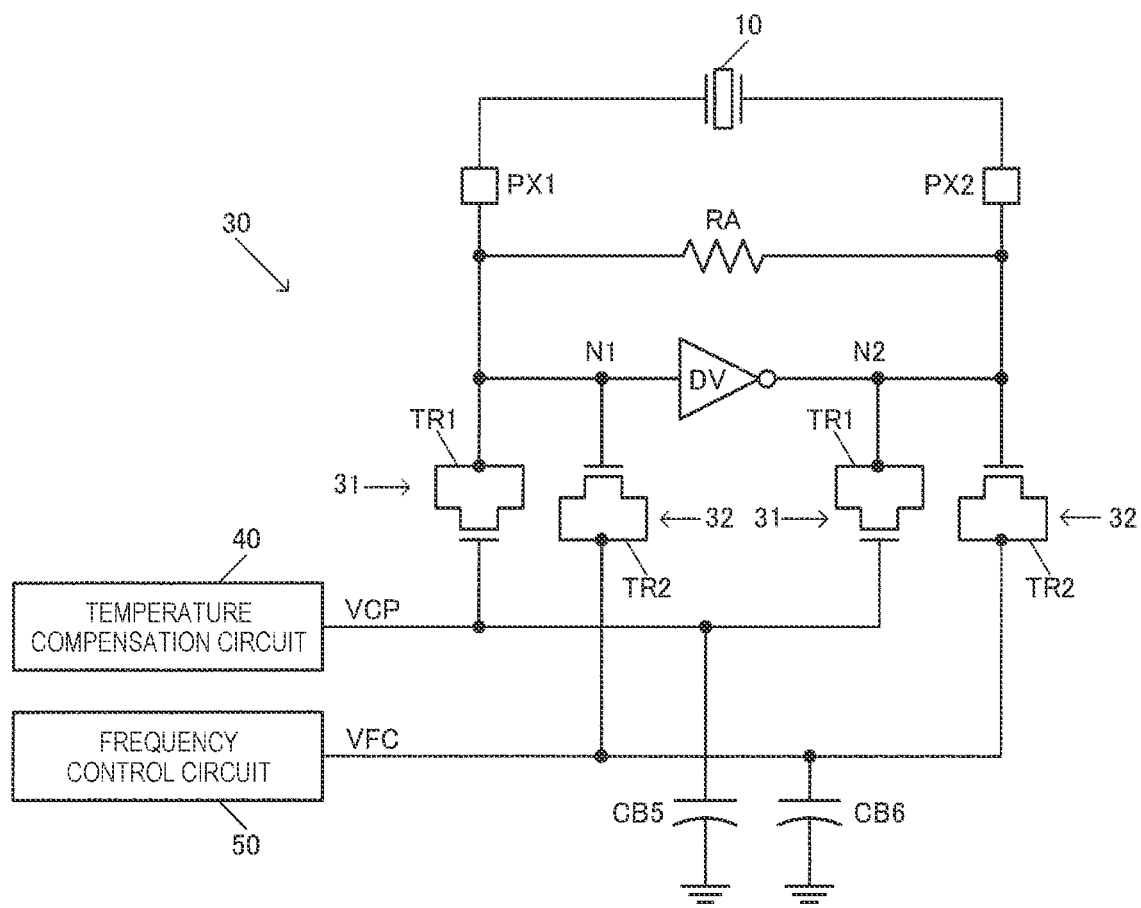
FIG. 8 is a diagram illustrating a first configuration example of an oscillation circuit.

Next, the oscillation circuit 30 will be described in detail. FIG. 8 is a diagram illustrating a first configuration example of the oscillation circuit 30. The oscillation circuit 30 in FIG. 8 includes a drive circuit DV, a resistor RA, the first variable capacitance circuit 31, and the second variable capacitance circuit 32. The oscillation circuit 30 can include a capacitor CB5 provided between a supply node of the temperature compensation voltage VCP and a low potential side power supply node, and a capacitor CB6 provided between a supply node of the frequency control voltage VFC and a low potential side power supply node. The low potential side power supply node is, for example, a ground node. One end of the resonator 10 is coupled to a node N1, which is an input node of the drive circuit DV, via the pad PX1, and the other end of the resonator 10 is coupled to a node N2, which is an output node of the drive circuit DV, via the pad PX2. The resistor RA serving as a feedback element from the output to the input of the drive circuit DV has one end coupled to the node N1 and the other end coupled to the node N2. In FIG. 8, the first variable capacitance circuit 31 and the second variable capacitance circuit 32 are provided at both the node N1 to which one end of the resonator 10 is coupled via the pad PX1 and the node N2 to which the other end of the resonator 10 is coupled via the pad PX2. However, the first variable capacitance circuit 31 and the second variable capacitance circuit 32 may be provided only at one of the nodes N1 and N2.

In FIG. 8, the first variable capacitance circuit 31 is implemented by a transistor TR1, and the second variable capacitance circuit 32 is implemented by a transistor TR2. The transistors TR1 and TR2 are variable capacitance elements of a metal oxide semiconductor (MOS) type, and are also referred to as MOS varactors. In FIG. 8, the first variable capacitance circuit 31 and the second variable capacitance circuit 32 are implemented by N-type transistors TR1 and TR2, respectively. The MOS type variable capacitance element is a capacitance element, in which a source and a drain of a MOS transistor are short-circuited and an electrostatic capacitance generated between the short-circuited source and drain and a gate is variably controlled by using a capacitance control voltage.

Although a case where each of the first variable capacitance circuit 31 and the second variable capacitance circuit 32 is implemented by one transistor that is a MOS type variable capacitance element will be mainly described as an example hereinafter, each of the first variable capacitance circuit 31 and the second variable capacitance circuit 32 may be implemented by two or more transistors provided in parallel. In addition, a modification in which a P-type transistor is used as a transistor constituting the first variable capacitance circuit 31 and the second variable capacitance circuit 32 can be made. Hereinafter, configurations of the first variable capacitance circuit 31 and the second variable capacitance circuit 32 provided at the node N1 will be mainly described as an example. Since configurations of the first variable capacitance circuit 31 and the second variable capacitance circuit 32 coupled to the node N2 are similar to those provided at the node N1, a detailed description thereof will be omitted.

In the transistor TR1 of the first variable capacitance circuit 31 on the node N1 side, the gate thereof is supplied with the temperature compensation voltage VCP from the temperature compensation circuit 40, and the source and the drain thereof are coupled to the node N1. Accordingly, a variable capacitance circuit having a positive voltage capacitance characteristic as illustrated in FIG. 3 is implemented. When the temperature compensation voltage VCP increases, a load capacitance of the node N1 increases, and when the temperature compensation voltage VCP decreases, the load capacitance of the node N1 decreases. Therefore, when the temperature compensation voltage VCP increases, the oscillation frequency decreases, and when the temperature compensation voltage VCP decreases, the oscillation frequency increases. As a result, with respect to the cubic frequency-temperature characteristic of the resonator 10 illustrated in FIG. 5, the temperature compensation voltage VCP illustrated in FIG. 7 cancels the increase and decrease of the oscillation frequency, and thus the temperature compensation for making the oscillation frequency constant can be implemented.

In the transistor TR2 of the second variable capacitance circuit 32 on the node N1 side, the source and the drain thereof are supplied with the frequency control voltage VFC from the frequency control circuit 50, and the gate thereof is coupled to the node N1. Accordingly, a variable capacitance circuit having a negative voltage capacitance characteristic as illustrated in FIG. 4 is implemented. When the frequency control voltage VFC increases, the load capacitance of the node N1 decreases, and when the frequency control voltage VFC decreases, the load capacitance of the node N1 increases. Therefore, when the frequency control voltage VFC increases, the oscillation frequency increases, and when the frequency control voltage VFC decreases, the oscillation frequency decreases. Therefore, it is possible to implement VC-TCXO that is a voltage-controlled temperature compensation oscillator configured to control the oscillation frequency of the oscillation circuit 30 based on the control voltage VC from the outside.

Figure 9:
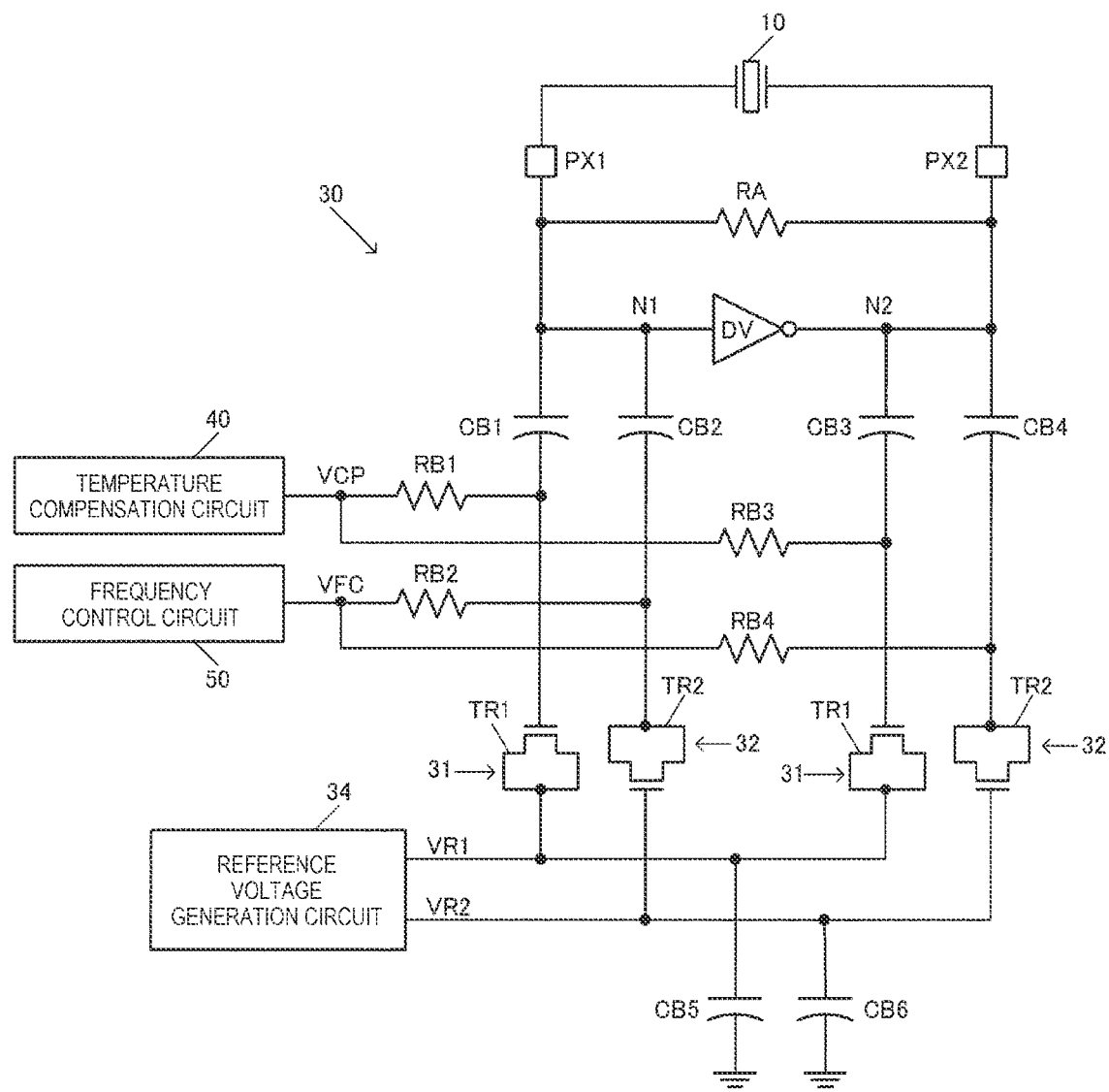
FIG. 9 is a diagram illustrating a second configuration example of the oscillation circuit.

FIG. 9 is a diagram illustrating a second configuration example of the oscillation circuit 30. The oscillation circuit 30 is not limited to the configurations in FIGS. 8 and 9, and various modifications such as omitting some of the components, adding other components, and replacing some of the components with other components can be made.

In the second configuration example in FIG. 9, the first variable capacitance circuit 31 on the node N1 side is implemented by the transistor TR1, and the second variable capacitance circuit 32 on the node N1 side is implemented by the transistor TR2. The first variable capacitance circuit 31 is electrically coupled to the node N1 via a capacitor CB1 for DC cut, and the second variable capacitance circuit 32 is electrically coupled to the node N1 via a capacitor CB2 for DC cut. In FIG. 9, a reference voltage generation circuit 34 that generates reference voltages VR1 and VR2 is provided. The first variable capacitance circuit 31 and the second variable capacitance circuit 32 on the node N2 side are coupled to the node N2 via capacitors CB3 and CB4, respectively, and configurations thereof are similar to those of the first variable capacitance circuit 31 and the second variable capacitance circuit 32 on the node N1 side, and thus a detailed description thereof will be omitted.

The transistor TR1, which is a first variable capacitance element, and the capacitor CB1 are provided in series between a supply node of the reference voltage VR1 and the node N1. Specifically, one end of the capacitor CB1 is coupled to the node N1, the other end of the capacitor CB1 is coupled to the gate of the transistor TR1, and the reference voltage VR1 is supplied to the source and the drain of the transistor TR1. The temperature compensation circuit 40 supplies the temperature compensation voltage VCP to a coupling node between the capacitor CB1 and the transistor TR1 via a resistor RB1.

The transistor TR2, which is a second variable capacitance element, and the capacitor CB2 are provided in series between a supply node of the reference voltage VR2 and the node N1. Specifically, one end of the capacitor CB2 is coupled to the node N1, the other end of the capacitor CB2 is coupled to the source and the drain of the transistor TR2, and the reference voltage VR2 is supplied to the gate of the transistor TR2. The frequency control circuit 50 supplies the frequency control voltage VFC to a coupling node between the capacitor CB2 and the transistor TR2 via a resistor RB2.

In FIG. 9, the first variable capacitance circuit 31 may be implemented by a plurality of transistors TR1 provided in parallel, and the second variable capacitance circuit 32 may be implemented by a plurality of transistors TR2 provided in parallel. In this case, a plurality of reference voltages VR1 different from one another may be supplied to the sources and drains of the plurality of transistors TR1 constituting the first variable capacitance circuit 31. A plurality of reference voltages VR2 different from one another may be supplied to the gates of the plurality of transistors TR2 constituting the second variable capacitance circuit 32. In this way, a linearity characteristic of a total capacitance of the first variable capacitance circuit 31 can be improved by overlapping different voltage capacitance characteristics of the plurality of transistors TR1. In addition, a linearity characteristic of a total capacitance of the second variable capacitance circuit 32 can be improved by overlapping different voltage capacitance characteristics of the plurality of transistors TR2.

Figure 10:
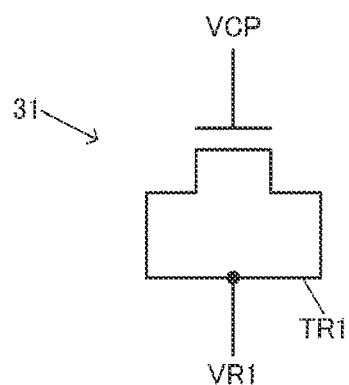
FIG. 10 is a diagram illustrating the first variable capacitance circuit.
Figure 11:
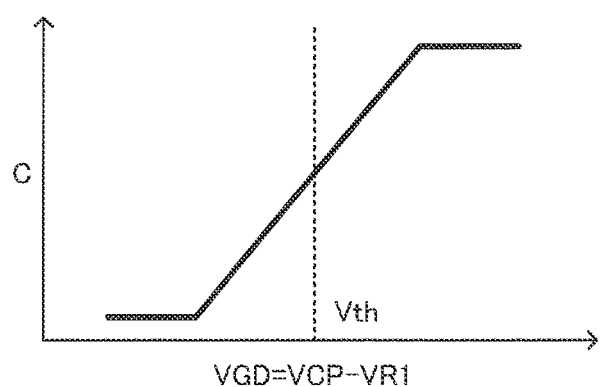
FIG. 11 is a graph illustrating a voltage capacitance characteristic of the first variable capacitance circuit.
Figure 12:
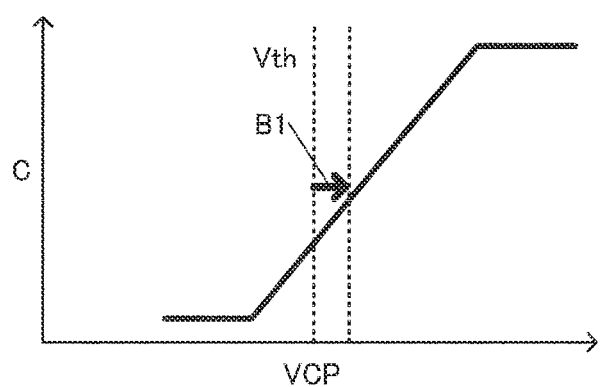
FIG. 12 is another graph illustrating the voltage capacitance characteristic of the first variable capacitance circuit.

As illustrated in FIG. 10, in the transistor TR1 constituting the first variable capacitance circuit 31, the temperature compensation voltage VCP is supplied to the gate, and the reference voltage VR1 is supplied to the source and the drain. Accordingly, as illustrated in FIG. 11, a voltage capacitance characteristic of the first variable capacitance circuit 31 is a positive voltage capacitance characteristic with respect to VGD=VCP−VR1, which is a gate-drain voltage. Therefore, as illustrated in FIG. 12, the voltage capacitance characteristic of the first variable capacitance circuit 31 is also a positive voltage capacitance characteristic with respect to the temperature compensation voltage VCP. Specifically, in FIG. 12, the positive voltage capacitance characteristic is shifted by the reference voltage VR1 as indicated by B1 with respect to that in FIG. 11.

In FIGS. 11 and 12, Vth is a threshold voltage of the transistor TR1. As described above, the inclination of the voltage capacitance characteristic is maximum in the vicinity of the center of the change range, and in FIG. 11, the inclination of the voltage capacitance characteristic is maximum when VGD=Vth. On the other hand, in FIG. 12, the inclination of the voltage capacitance characteristic is maximum when VCP=Vth+VR1.

Figure 13:
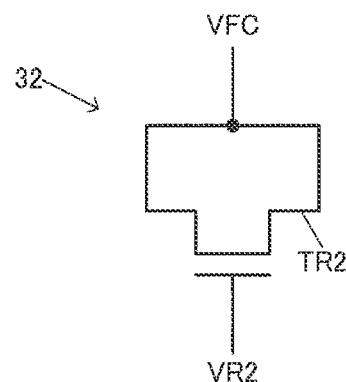
FIG. 13 is a diagram illustrating the second variable capacitance circuit.
Figure 14:
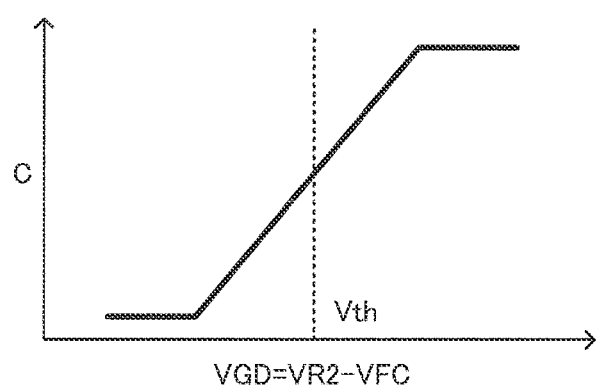
FIG. 14 is a graph illustrating a voltage capacitance characteristic of the second variable capacitance circuit.
Figure 15:
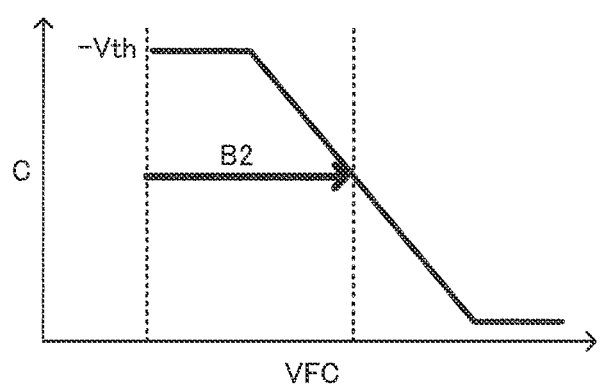
FIG. 15 is another graph illustrating the voltage capacitance characteristic of the second variable capacitance circuit.

As illustrated in FIG. 13, in the transistor TR2 constituting the second variable capacitance circuit 32, the frequency control voltage VFC is supplied to the source and the drain, and the reference voltage VR2 is supplied to the gate. Accordingly, as illustrated in FIG. 14, a voltage capacitance characteristic of the second variable capacitance circuit 32 is a positive voltage capacitance characteristic with respect to VGD=VR2−VFC, which is a gate-drain voltage. In FIG. 14, Vth is a threshold voltage of the transistor TR2. Therefore, as illustrated in FIG. 15, the voltage capacitance characteristic of the second variable capacitance circuit 32 is a negative voltage capacitance characteristic with respect to the frequency control voltage VFC. Specifically, in FIG. 15, the negative voltage capacitance characteristic has an inverted polarity and is shifted by the reference voltage VR2 as indicated by B2 with respect to that in FIG. 14.

3. Temperature Compensation Circuit

Figure 16:
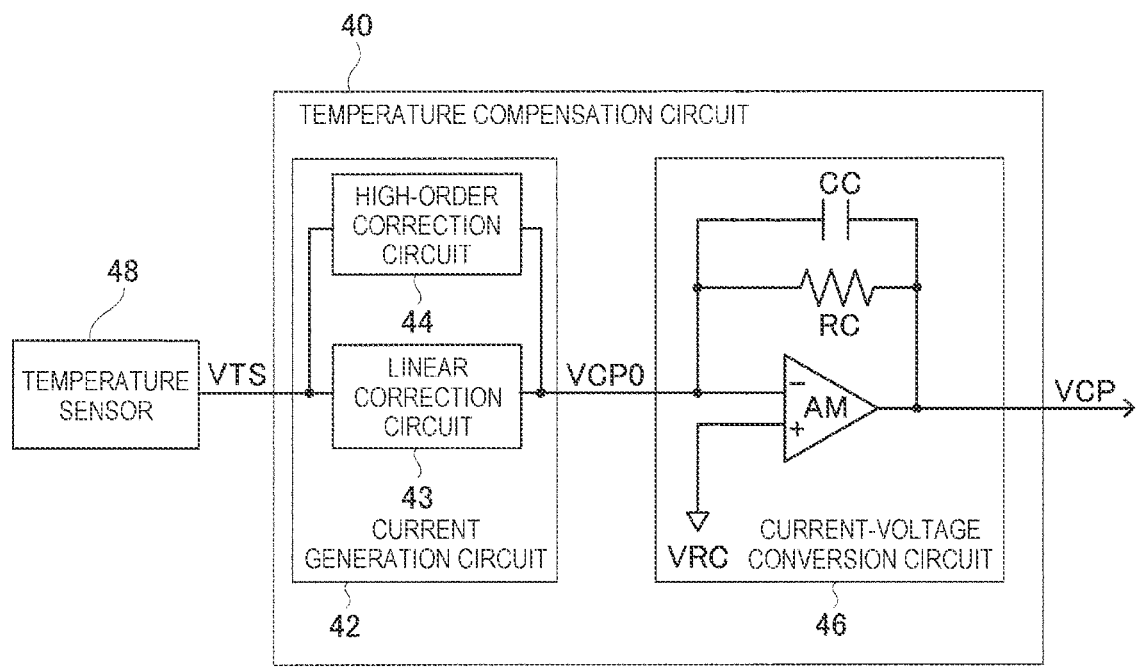
FIG. 16 is a diagram illustrating a configuration example of a temperature compensation circuit.

FIG. 16 is a diagram illustrating a configuration example of the temperature compensation circuit 40. The temperature compensation circuit 40 is not limited to the configuration in FIG. 16, and various modifications such as omitting some of the components, adding other components, and replacing some of the components with other components can be made.

The temperature compensation circuit 40 is a circuit that outputs the temperature compensation voltage VCP according to polynomial approximation using a temperature as a variable. The temperature compensation circuit 40 includes a current generation circuit 42 and a current-voltage conversion circuit 46. The current generation circuit 42 generates a function current based on a temperature detection result of the temperature sensor 48. For example, the current generation circuit 42 generates a function current for temperature compensating the frequency-temperature characteristic of the resonator 10 as illustrated in FIG. 5, based on a temperature detection voltage VTS that is a temperature detection result from the temperature sensor 48. The current-voltage conversion circuit 46 converts the function current from the current generation circuit 42 into a voltage and outputs the temperature compensation voltage VCP. Specifically, the current-voltage conversion circuit 46 outputs the temperature compensation voltage VCP by an amplifier circuit AM for a class A operation.

The current generation circuit 42 includes a linear correction circuit 43 and a high-order correction circuit 44. The linear correction circuit 43 outputs, based on the temperature detection voltage VTS, a linear current approximating a linear function. For example, the linear correction circuit 43 outputs a linear function current based on linear correction data corresponding to a linear coefficient of a polynomial in polynomial approximation. The linear correction circuit 43 includes, for example, an operational amplifier, a first variable resistance circuit, a second variable resistance circuit, and a third variable resistance circuit. The operational amplifier, the first variable resistance circuit, and the second variable resistance circuit constitute a non-inverting amplifier circuit. The non-inverting amplifier circuit amplifies the temperature detection voltage VTS with reference to a reference voltage VRC, for example. The non-inverting amplifier circuit outputs the linear current to an input node of the current-voltage conversion circuit 46 via the third variable resistance circuit.

The high-order correction circuit 44 outputs, based on the temperature detection voltage VTS, a high-order current approximating a high-order function to the current-voltage conversion circuit 46. For example, the high-order correction circuit 44 outputs a high-order current based on high-order correction data corresponding to a high-order coefficient of a polynomial in polynomial approximation. As an example, the high-order correction circuit 44 outputs a cubic current that approximates a cubic function. In this case, the high-order correction circuit 44 includes a first differential circuit that performs a differential operation based on the temperature detection voltage VTS, and a second differential circuit that performs a differential operation based on an output voltage of the first differential circuit and the temperature detection voltage VTS to output a cubic current. In FIG. 16, the temperature sensor 48 performs offset correction on the temperature detection voltage VTS based on zero-order correction data corresponding to a zero-order coefficient of a polynomial. That is, the temperature sensor 48 adjusts the offset of the temperature detection voltage VTS by offset indicated by the zero-order correction data. The offset correction on the temperature detection voltage VTS corresponds to zero-order correction in the temperature compensation for the oscillation frequency. The high-order correction circuit 44 may further include a correction circuit that performs fourth-order or higher-order correction. For example, the high-order correction circuit 44 may further include a quartic correction circuit that outputs a quartic current approximating a quartic function, a quintic correction circuit that outputs a quintic current approximating a quintic function, and the like.

The current-voltage conversion circuit 46 adds the linear current and the high-order current, and performs current-voltage conversion on the added current to output the temperature compensation voltage VCP. Accordingly, the temperature compensation voltage VCP that approximates a polynomial function is generated.

The current-voltage conversion circuit 46 includes an amplifier circuit AM, a resistor RC, and a capacitor CC. The amplifier circuit AM is implemented by an operational amplifier. The resistor RC and the capacitor CC are coupled in parallel between an output terminal and an inverting input terminal of the amplifier circuit AM. The reference voltage VRC is input to a non-inverting input terminal of the amplifier circuit AM. Accordingly, the current-voltage conversion circuit 46 outputs the temperature compensation voltage VCP by, for example, the amplifier circuit AM for a class A operation.

According to the temperature compensation circuit 40 having such a configuration, the function current generated by the current generation circuit 42 based on the temperature detection result of the temperature sensor 48 can be converted into a voltage and output as the temperature compensation voltage VCP by the current-voltage conversion circuit 46. Since the current-voltage conversion circuit 46 outputs the temperature compensation voltage by the amplifier circuit AM for a class A operation, the temperature compensation voltage VCP for appropriately temperature compensating the oscillation frequency in a wide temperature range can be output by the amplifier circuit AM for a class A operation that has a small circuit scale and a simple configuration.

Figure 17:
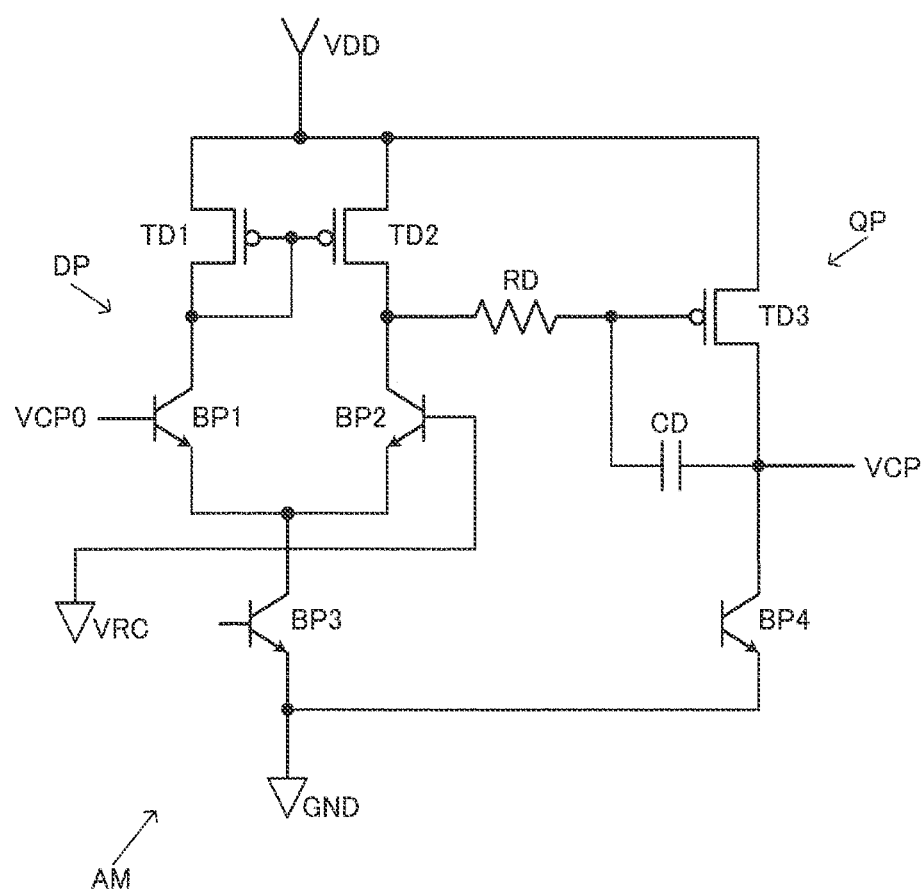
FIG. 17 is a diagram illustrating a configuration example of an amplifier circuit for a class A operation.
Figure 18:
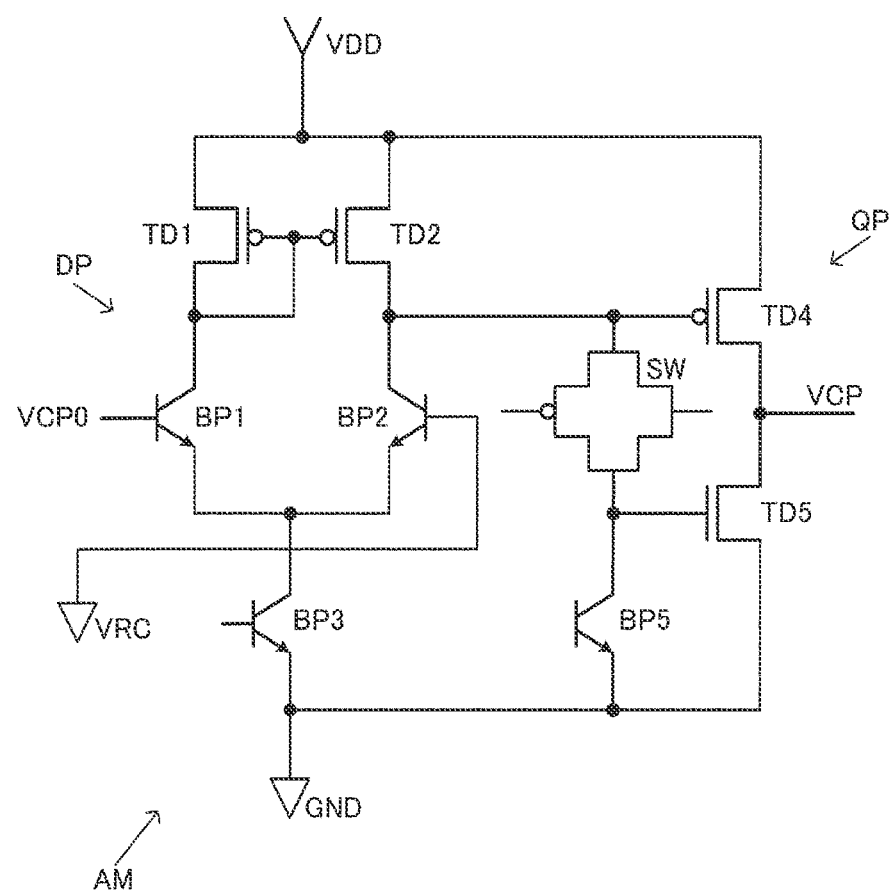
FIG. 18 is a diagram illustrating a configuration example of the amplifier circuit for a class AB operation.

FIG. 17 is a diagram illustrating a configuration example of the amplifier circuit AM for a class A operation. The amplifier circuit AM includes a differential part DP and an output part QP. The differential part DP includes transistors TD1 and TD2 constituting a current mirror circuit, bipolar transistors BP1 and BP2 that are transistors as a differential pair, and a bipolar transistor BP3 for a current source. The transistors TD1 and TD2 are P-type transistors whose gates are commonly coupled. A voltage VCP0 from the current generation circuit 42 is input to an inverting input terminal that is a base of the bipolar transistor BP1, and the reference voltage VRC is input to a non-inverting input terminal that is a base of the bipolar transistor BP2. The output part QP includes a P-type drive transistor TD3 and a bipolar transistor BP4 for a current source, which are provided in series between a VDD node and a GND node. The amplifier circuit AM is provided with a resistor RD for phase compensation and a capacitor CD. Note that MOS transistors may be used instead of the bipolar transistors BP1 to BP4.

On the other hand, FIG. 18 is a diagram illustrating a configuration example of the amplifier circuit AM for a class AB operation. FIG. 18 is different from FIG. 17 in that the output part QP includes a P-type drive transistor TD4 and an N-type drive transistor TD5 that are provided in series between a VDD node and a GND node. Further, in FIG. 18, a switch circuit SW for controlling a gate of the drive transistor TD5 and a bipolar transistor BP5 are provided.

As described above, when the second variable capacitance circuit 32 having a negative voltage capacitance characteristic is used in order to perform temperature compensation on the frequency-temperature characteristic of the resonator 10 illustrated in FIG. 5, the temperature compensation circuit 40 needs to output the temperature compensation voltage VCP having the temperature characteristic illustrated in FIG. 6. In this case, as indicated by A2 in FIG. 6, the amplifier circuit AM of the temperature compensation circuit 40 needs to output a sufficiently low voltage at the upper limit of the operating temperature range. However, when the amplifier circuit AM of a class A operation as illustrated in FIG. 17 is used as the output amplifier of the temperature compensation circuit 40, it is difficult to output a sufficiently low temperature compensation voltage VCP indicated by A2 in FIG. 6 by the bipolar transistor BP4 that is a transistor of a current source of the output part QP. That is, since the bipolar transistor BP4 for a current source is a transistor through which a constant current flows, the bipolar transistor BP4 does not have a capability of drawing a large current to a low potential power supply side, and it is difficult to output a sufficiently low temperature compensation voltage VCP. In this case, when the constant current is set to a large current, it is easy to output a low voltage, but when the constant current is set to a large current, power consumption increases. Therefore, when the second variable capacitance circuit 32 having a negative characteristic is used for temperature compensating the frequency-temperature characteristic, it is essential to use the amplifier circuit AM for a class AB operation as illustrated in FIG. 18 or the like. This is because, according to the amplifier circuit AM for a class AB operation, a low temperature compensation voltage VCP can be output by sufficiently turning on the N-type drive transistor TD5 of the output unit QP. However, when the amplifier circuit AM for a class AB operation is used, the circuit is complicated and the circuit scale is large. For example, in the amplifier circuit AM for a class AB operation, a filter circuit cannot be provided at the gate of the drive transistor of the output part QP. When a filter circuit is provided at an output node of the output part QP, the mirror effect is not obtained. Therefore, a capacitor having a large capacitance is required to set the cutoff frequency same as that of the amplifier circuit AM for a class A operation, and the scale of the circuit is increased.

In this regard, in the present embodiment, the first variable capacitance circuit 31 having a positive voltage capacitance characteristic is used in order to perform temperature compensation on the frequency-temperature characteristic of the resonator 10 as illustrated in FIG. 5. Therefore, the temperature compensation circuit 40 outputs the temperature compensation voltage VCP having the temperature characteristic as illustrated in FIG. 7. In this case, the amplifier circuit AM of the temperature compensation circuit 40 needs to output a sufficiently high voltage at the upper limit of the operating temperature range as indicated by A3 in FIG. 7. Even when the amplifier circuit AM for a class A operation illustrated in FIG. 17 is used as the output amplifier of the temperature compensation circuit 40, a high voltage as indicated by A3 in FIG. 7 can be easily output by sufficiently turning on the P-type drive transistor TD3 of the output part QP. Therefore, it is not essential to use the amplifier circuit AM for a class AB operation as illustrated in FIG. 18, and thus a reduction in scale and simplification of the circuit can be achieved.

4. Frequency Control Circuit

Figure 19:
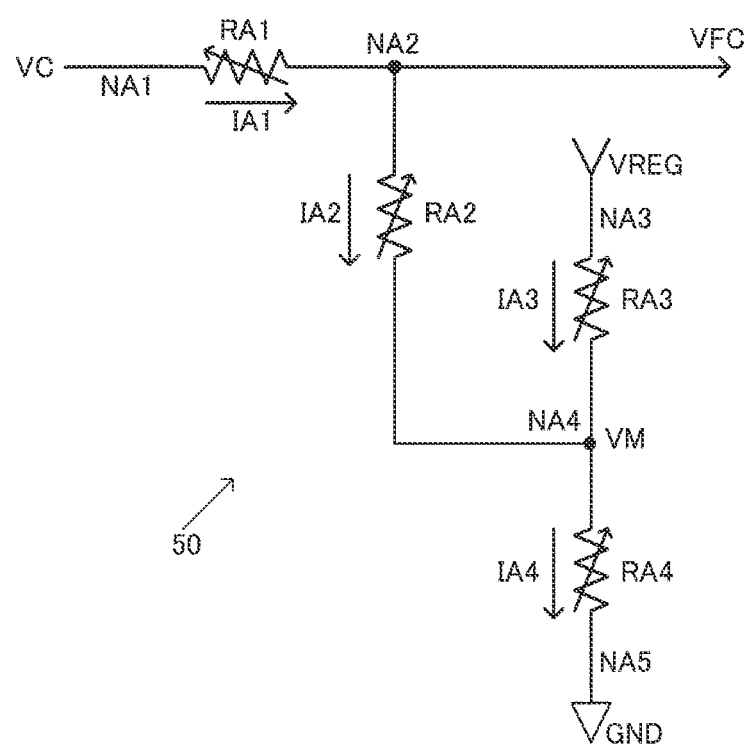
FIG. 19 is a diagram illustrating a configuration example of a frequency control circuit.

Next, the frequency control circuit 50 will be described in detail. FIG. 19 is a diagram illustrating a configuration example of the frequency control circuit 50. The frequency control circuit 50 is not limited to the configuration in FIG. 19, and various modifications such as omitting some of the components, adding other components, and replacing some of the components with other components can be made.

The frequency control circuit 50 according to the present embodiment outputs, as the frequency control voltage VFC, a voltage generated by dividing the control voltage VC, which is input from the outside, using at least one variable resistor. For example, the frequency control circuit 50 generates the frequency control voltage VFC by dividing the control voltage VC using a variable resistor, without using an amplifier implemented by an operational amplifier or the like. For example, when an amplifier is used for gain adjustment of the frequency control circuit 50, the circuit scale increases, the power consumption increases, and noise increases with an increase in the number of transistors. In this regard, the frequency control circuit 50 in FIG. 19 outputs, as the frequency control voltage VFC, a voltage generated by dividing the control voltage VC using a variable resistor. In this way, the oscillation frequency can be controlled by using the frequency control voltage VFC without using an amplifier that has a large circuit scale, a high power consumption and much noise, and thus a reduction in scale, a reduction in power consumption, a reduction in noise, and the like of the circuit device 20 can be achieved.

Specifically, the frequency control circuit 50 in FIG. 19 includes a first variable resistor RA1, a second variable resistor RA2, a third variable resistor RA3, and a fourth variable resistor RA4. The first variable resistor RA1 is provided between an input node NA1 of the control voltage VC and an output node NA2 of the frequency control voltage VFC. One end of the second variable resistor RA2 is coupled to the output node NA2 of the frequency control voltage VFC. The third variable resistor RA3 is provided between an input node NA3 of a reference voltage VREG and a coupling node NA4 to which the other end of the second variable resistor RA2 is coupled. The fourth variable resistor RA4 is provided between the coupling node NA4 and a low potential power supply node NA5. The low potential power supply node NA5 is, for example, a GND node.

In the frequency control circuit 50 in FIG. 19, currents IA1, IA2, IA3, and IA4 flowing through the first variable resistor RA1, the second variable resistor RA2, the third variable resistor RA3, and the fourth variable resistor RA4 respectively are obtained using the following equations (1), (2), and (3).

$$IA1 = IA2 = \frac{VC - VM}{RA1 + RA2} = \frac{VC - VFC}{RA1} = \frac{VFC - VM}{RA2} \quad (1)$$

$$IA3 = \frac{VREG - VM}{RA3} \quad (2)$$

$$IA4 = IA2 + IA3 = \frac{VC - VM}{RA1 + RA2} + \frac{VREG - VM}{RA3} \quad (3)$$

Accordingly, the voltage VM at the coupling node NA4, which is a voltage division node between the third variable resistor RA3 and the fourth variable resistor RA4, is obtained by the following equations (4) and (5).

$$VM = RA4 \times IA4 = RA4 \times \left(\frac{VC - VM}{RA1 + RA2} + \frac{VREG - VM}{RA3}\right) \quad (4)$$

$$VM = \frac{(RA1 + RA2) \times RA3 \times RA4}{(RA1 + RA2) \times (RA3 + RA4) + RA3 \times RA4} \times \left(\frac{VC}{RA1 + RA2} + \frac{VREG}{RA3}\right) \quad (5)$$

Therefore, the frequency control voltage VFC can be obtained using the following equations (6) and (7).

$$VFC = \frac{RA2}{RA1 + RA2} \times VC + \frac{RA1}{RA1 + RA2} \times VM \quad (6)$$

-continued
$$VFC = \frac{(RA2(RA3+RA4)+RA3 \times RA4)VC + RA1 \times RA4 \times VREG}{(RA1+RA2) \times (RA3+RA4)+RA3 \times RA4} \quad (7)$$

Then, G=ΔVFC/ΔVC, which is gain in the frequency control circuit 50, is expressed by the following equation (8).

$$G = \frac{\Delta VFC}{\Delta VC} = \frac{RA2(RA3+RA4)+RA3 \times RA4}{(RA1+RA2) \times (RA3+RA4)+RA3 \times RA4} > 0 \quad (8)$$

As shown in the above equation (8), according to the frequency control circuit 50 of the present embodiment, it is possible to adjust the gain G of the frequency control voltage VFC with respect to the control voltage VC with a small-scale circuit configuration that does not use an amplifier. For example, the gain G in the frequency control circuit 50 can be adjusted by adjusting resistance values of the first variable resistor RA1 to the fourth variable resistor RA4. Therefore, the gain G of the frequency control voltage VFC with respect to the control voltage VC can be adjusted to any value without using an amplifier that has a large circuit scale, a high power consumption and much noise.

5. Setting of Sensitivity

In the present embodiment, an absolute value of frequency-voltage sensitivity of the first variable capacitance circuit 31 is set to be higher than an absolute value of frequency-voltage sensitivity of the second variable capacitance circuit 32. For example, sensitivity KV=ΔF/ΔV, which is the frequency-voltage sensitivity, is expressed by the following equation (9). CL is an overall load capacitance of the oscillation circuit 30, and C0 and C1 are equivalent parallel capacitance and series capacitance of the resonator 10.

$$KV = \frac{\Delta F}{\Delta V} = -\frac{C1}{2 \cdot (C0+CL)^2} \times \frac{\Delta CL}{\Delta V} \quad (9)$$

As is clear from the above equation (9), ΔF, which indicates a frequency change, can be increased by increasing an absolute value of the sensitivity KV. Therefore, by setting the absolute value of the sensitivity KV of the first variable capacitance circuit 31 for temperature compensation to be higher than an absolute value of the sensitivity KV of the second variable capacitance circuit 32 for frequency control, a frequency fluctuation range of the first variable capacitance circuit 31 for temperature compensation can be made wider than a frequency fluctuation range of the second variable capacitance circuit 32 for frequency control. For example, according to specifications or the like, a frequency fluctuation range of about ±20 ppm to 30 ppm is required on the temperature compensation side, and a frequency fluctuation range of about ±5 ppm to 15 ppm is required on the frequency control side. Therefore, by setting the absolute value of the sensitivity KV of the first variable capacitance circuit 31 to be higher than the absolute value of the sensitivity KV of the second variable capacitance circuit 32, it is possible to make the frequency fluctuation range on the temperature compensation side wider than the frequency fluctuation range on the frequency control side, and it is possible to meet the requirements according to the specifications or the like. In order to increase the absolute value of the sensitivity of a variable capacitance circuit, a size of a transistor constituting the variable capacitance circuit needs to be increased. Therefore, in order to set the absolute value of the sensitivity KV of the first variable capacitance circuit 31 to be higher than the absolute value of the sensitivity KV of the second variable capacitance circuit 32, a size of the transistor TR1 constituting the first variable capacitance circuit 31 may be made larger than a size of the transistor TR2 constituting the second variable capacitance circuit 32. In the following description, the absolute value of the sensitivity is simply referred to as sensitivity as appropriate.

Figure 20:
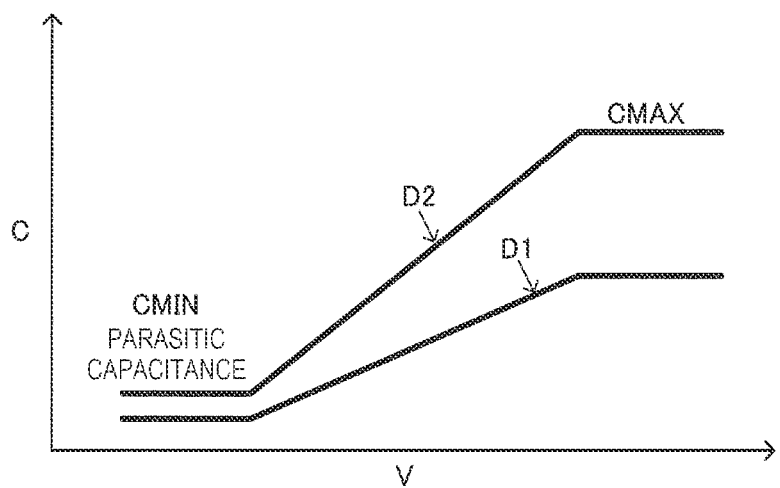
FIG. 20 is a graph illustrating a magnitude relationship between capacitances of the first variable capacitance circuit and the second variable capacitance circuit.
Figure 21:
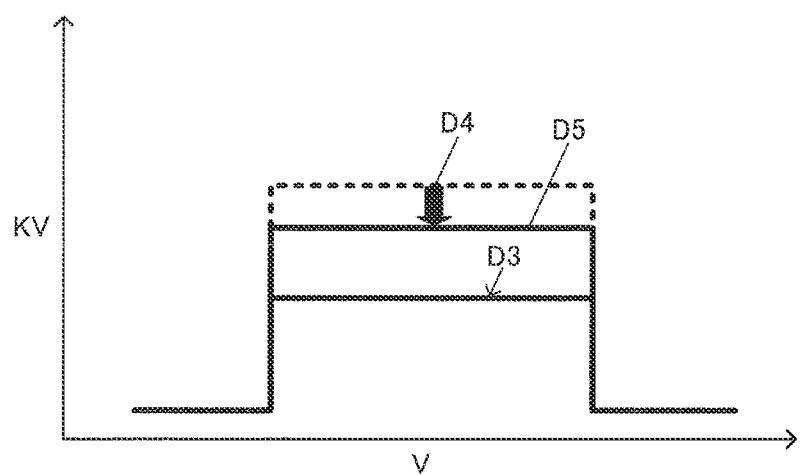
FIG. 21 is another graph illustrating the magnitude relationship between the capacitances of the first variable capacitance circuit and the second variable capacitance circuit.

For example, FIG. 20 is a graph illustrating a voltage capacitance characteristic of a variable capacitance circuit. In FIG. 20, an inclination of a voltage capacitance characteristic of D2 is doubled as compared with that of D1. That is, capacitance voltage sensitivity of the variable capacitance circuit is doubled. However, even if the capacitance voltage sensitivity, which is the inclination of the voltage capacitance characteristic of the variable capacitance circuit, is doubled, the sensitivity KV=ΔF/ΔV is not doubled as illustrated in FIG. 21. That is, even if the inclination of the voltage capacitance characteristic is doubled as indicated by D1 and D2 in FIG. 20, the sensitivity KV expressed by the above equation (9) is not twice the sensitivity indicated by D3 in FIG. 21, but the sensitivity decreases by an amount corresponding to an increase in the load capacitance CL caused by an increase in a parasitic capacitance as indicated by D4, and is the sensitivity indicated by D5.

For example, when the sensitivity KV of the second variable capacitance circuit 32 for frequency control is increased, the sensitivity KV of the first variable capacitance circuit 31 for temperature compensation decreases with an increase in the load capacitance CL caused by a parasitic capacitance of the second variable capacitance circuit 32. Therefore, in the present embodiment, the sensitivity KV of the first variable capacitance circuit 31 for temperature compensation is preferentially made higher, and the sensitivity KV of the second variable capacitance circuit 32 for frequency control is made lower than that on the temperature compensation side. In this way, the transistor size of the second variable capacitance circuit 32 can be reduced, the circuit scale can be reduced, and a decrease in the sensitivity KV of the first variable capacitance circuit 31 caused by the parasitic capacitance of the second variable capacitance circuit 32 can also be prevented.

6. Oscillator

Figure 22:
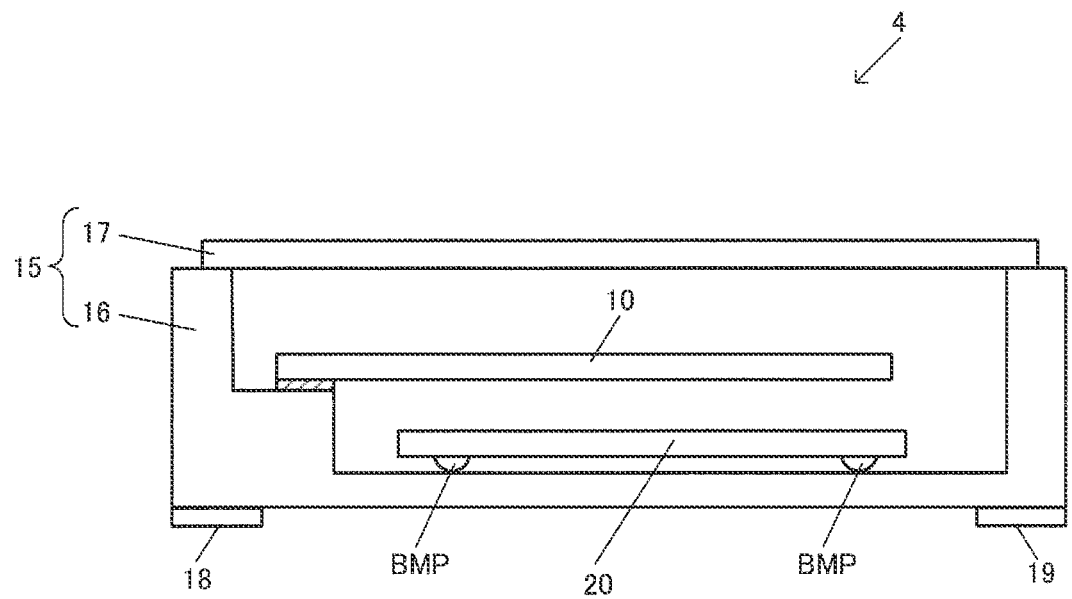
FIG. 22 is a diagram illustrating a first structure example of the oscillator.

FIG. 22 is a diagram illustrating a first structure example of the oscillator 4 according to the present embodiment. The oscillator 4 includes the resonator 10, the circuit device 20, and a package 15 that accommodates the resonator 10 and the circuit device 20. The package 15 is made of, for example, ceramic, and has an accommodating space on an inner side. The resonator 10 and the circuit device 20 are accommodated in the accommodating space. The accommodating space is hermetically sealed, and is desirably in a depressurized state that is a state close to vacuum. With the package 15, the resonator 10 and the circuit device 20 can be suitably protected from impact, dust, heat, moisture, and the like.

The package 15 includes a base 16 and a lid 17. Specifically, the package 15 includes the base 16 that supports the resonator 10 and the circuit device 20, and the lid 17 that is joined to an upper surface of the base 16 so that the accommodating space is defined between the base 16 and the lid 17. The resonator 10 is supported by a step portion, which is provided at an inner side of the base 16, via a terminal electrode. The circuit device 20 is disposed on an inner bottom surface of the base 16. Specifically, the circuit device 20 is disposed such that an active surface thereof faces the inner bottom surface of the base 16. The active surface is a surface at which a circuit element of the circuit device 20 is formed. Bumps BMP are formed at terminals of the circuit device 20. The circuit device 20 is supported by the inner bottom surface of the base 16 via the conductive bumps BMP. The conductive bumps BMP are, for example, metal bumps, and the resonator 10 is electrically coupled to the circuit device 20 via the bumps BMP, an internal wiring of the package 15, a terminal electrode, and the like. The circuit device 20 is electrically coupled to external terminals 18 and 19 of the oscillator 4 via the bumps BMP and the internal wiring of the package 15. The external terminals 18 and 19 are formed at an outer bottom surface of the package 15. The external terminals 18 and 19 are coupled to an external device via an external wiring. The external wiring is, for example, a wiring formed at a circuit board mounted on the external device. Accordingly, a clock signal or the like can be output to the external device.

Although the circuit device 20 is flip mounted such that the active surface of the circuit device 20 faces downward in FIG. 22, the present embodiment is not limited to such mounting. For example, the circuit device 20 may be mounted such that the active surface of the circuit device 20 faces upward. That is, the circuit device 20 is mounted such that the active surface faces the resonator 10.

Figure 23:
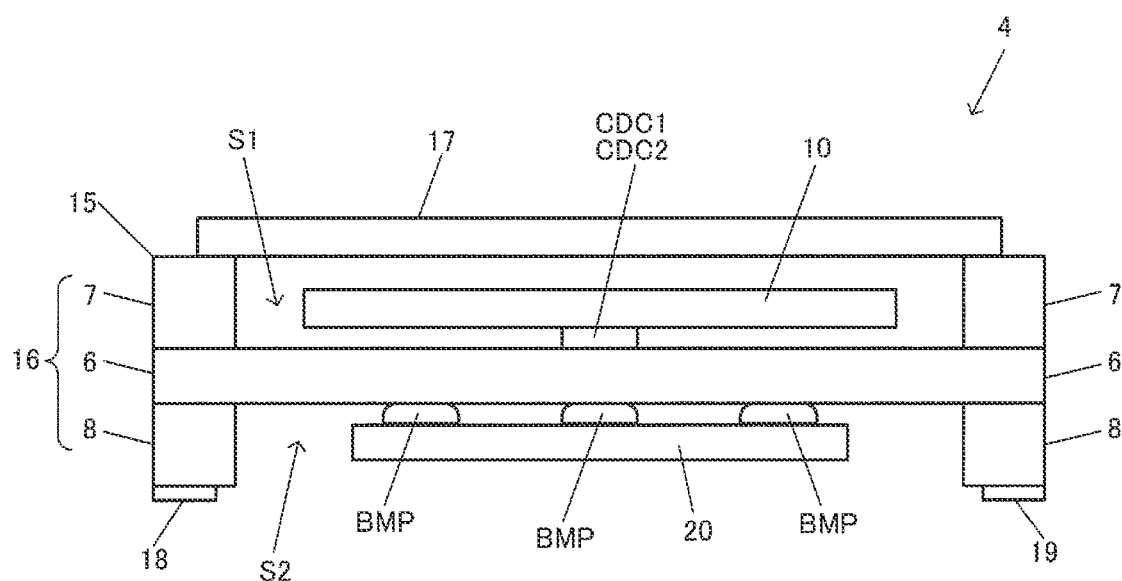
FIG. 23 is a diagram illustrating a second structure example of the oscillator.

FIG. 23 is a diagram illustrating a second structure example of the oscillator 4. The oscillator 4 includes the resonator 10, the circuit device 20, and the package 15 that accommodates the resonator 10 and the circuit device 20. The package 15 includes the base 16 and the lid 17. The base 16 includes a first substrate 6 that is an intermediate substrate, a second substrate 7 having a substantially rectangular frame shape that is laminated on an upper surface side of the first substrate 6, and a third substrate 8 having a substantially rectangular frame shape that is laminated on a bottom surface side of the first substrate 6. The lid 17 is joined to an upper surface of the second substrate 7, and the resonator 10 is accommodated in an accommodating space S1 that is defined by the first substrate 6, the second substrate 7, and the lid 17. For example, the resonator 10 is hermetically sealed in the accommodating space S1, and the accommodating space S1 is desirably in a depressurized state that is a state close to vacuum. Accordingly, the resonator 10 can be suitably protected from impact, dust, heat, moisture, and the like. The circuit device 20 that is a semiconductor chip is accommodated in an accommodating space S2 defined by the first substrate 6 and the third substrate 8. The external terminals 18 and 19 that are external coupling electrode terminals of the oscillator 4 are formed at a bottom surface of the third substrate 8.

In the accommodating space S1, the resonator 10 is coupled to, by conductive coupling portions CDC1 and CDC2, a first electrode terminal and a second electrode terminal (not illustrated) formed at an upper surface of the first substrate 6. For example, the conductive coupling portions CDC1 and CDC2 may be implemented by conductive bumps such as metal bumps, or may be implemented by conductive adhesives. Specifically, for example, a first electrode pad (not illustrated) formed at one end of the tuning-fork type resonator 10 is coupled to, via the conductive coupling portion CDC1, the first electrode terminal formed at the upper surface of the first substrate 6. The first electrode terminal is electrically coupled to the pad PX1 of the circuit device 20. A second electrode pad (not illustrated) formed at the other end of the tuning-fork type resonator 10 is coupled to, via the conductive coupling portion CDC2, the second electrode terminal formed at the upper surface of the first substrate 6. The second electrode terminal is electrically coupled to the pad PX2 of the circuit device 20. Accordingly, the one end and the other end of the resonator 10 can be electrically coupled to the pads PX1 and PX2 of the circuit device 20 via the conductive coupling portions CDC1 and CDC2. The conductive bumps BMP are formed at a plurality of pads of the circuit device 20 that is a semiconductor chip, and these conductive bumps BMP are coupled to a plurality of electrode terminals formed at a bottom surface of the first substrate 6. The electrode terminals coupled to the pads of the circuit device 20 are electrically coupled to the external terminals 18 and 19 of the oscillator 4 via an internal wiring or the like.

The oscillator 4 may be an oscillator of a wafer level package (WLP). In this case, the oscillator 4 includes: a base that includes a semiconductor substrate and a penetration electrode penetrating between a first surface and a second surface of the semiconductor substrate; the resonator 10 that is fixed to the first surface of the semiconductor substrate via a conductive joining member such as a metal bump; and an external terminal that is provided at a second surface side of the semiconductor substrate via an insulating layer such as a re-wiring layer. An integrated circuit serving as the circuit device 20 is formed at the first surface or the second surface of the semiconductor substrate. In this case, by bonding a first semiconductor wafer disposed with a plurality of bases, each having the resonator 10 and the integrated circuit, to a second semiconductor wafer formed with a plurality of lids, the plurality of bases are joined to the plurality of lids, and then dicing of the oscillators 4 is performed using a dicing saw or the like. In this way, the oscillator 4 of the wafer level package can be implemented, and the oscillator 4 can be manufactured with high throughput and low cost.

As described above, a circuit device according to the present embodiment includes: an oscillation circuit configured to oscillate a resonator; a temperature compensation circuit configured to output a temperature compensation voltage for temperature compensating an oscillation frequency of the oscillation circuit, based on a temperature detection result of a temperature sensor; and a frequency control circuit configured to output a frequency control voltage for the oscillation frequency. The oscillation circuit includes a first variable capacitance circuit whose capacitance change characteristic with respect to a capacitance control voltage is a positive characteristic, and a second variable capacitance circuit whose capacitance change characteristic with respect to the capacitance control voltage is a negative characteristic. The temperature compensation circuit supplies the temperature compensation voltage as the capacitance control voltage to the first variable capacitance circuit, and the frequency control circuit supplies the frequency control voltage as the capacitance control voltage to the second variable capacitance circuit.

In this way, since the oscillation circuit is provided with the first variable capacitance circuit having a positive characteristic to which the temperature compensation voltage from the temperature compensation circuit is supplied as the capacitance control voltage, when the temperature rises, a capacitance of the first variable capacitance circuit increases and the oscillation frequency of the oscillation circuit decreases, and when the temperature falls, the capacitance of the first variable capacitance circuit decreases and the oscillation frequency of the oscillation circuit increases. Accordingly, it is possible to implement temperature compensation in which a change in the oscillation frequency due to a temperature change is canceled out and the oscillation frequency is made constant. In addition, since the oscillation circuit is provided with the second variable capacitance circuit having a negative characteristic to which the frequency control voltage from the frequency control circuit is supplied as the capacitance control voltage, when the frequency control voltage increases, a capacitance of the second variable capacitance circuit decreases and the oscillation frequency of the oscillation circuit increases, and when the frequency control voltage decreases, the capacitance of the second variable capacitance circuit increases and the oscillation frequency of the oscillation circuit decreases. Therefore, it is possible to implement control of the oscillation frequency based on the frequency control voltage while implementing appropriate temperature compensation for the oscillation frequency in a wide temperature range by the temperature compensation circuit.

In the present embodiment, the temperature compensation circuit may include an amplifier circuit for a class A operation configured to output the temperature compensation voltage.

In this way, appropriate temperature compensation for the oscillation frequency in a wide temperature range can be implemented by the temperature compensation circuit including an amplifier circuit for a class A operation that has a smaller circuit scale and a simpler configuration than an amplifier circuit for a class AB operation.

In the present embodiment, the temperature compensation circuit may include a current generation circuit configured to generate a function current based on the temperature detection result of the temperature sensor, and a current-voltage conversion circuit configured to convert the function current into a voltage and output the temperature compensation voltage, and the current-voltage conversion circuit may output the temperature compensation voltage by the amplifier circuit for a class A operation.

In this way, the function current generated by the current generation circuit based on the temperature detection result of the temperature sensor can be converted into a voltage and output as the temperature compensation voltage by the current-voltage conversion circuit. Since the current-voltage conversion circuit outputs the temperature compensation voltage by the amplifier circuit for a class A operation, the temperature compensation voltage for appropriately temperature compensating the oscillation frequency in a wide temperature range can be output by the amplifier circuit for a class A operation that has a small circuit scale and a simple configuration.

In the present embodiment, the resonator may have a frequency-temperature characteristic approximated by using a cubic curve, and the resonator may be a resonator in which the oscillation frequency at an upper limit of an operating temperature range is larger than a local maximum value of the oscillation frequency in a state where temperature compensation is not performed.

In this way, for the resonator in which the oscillation frequency at the upper limit of the operating temperature range is larger than the local maximum value of the oscillation frequency, a temperature range on the high temperature side is wider than a temperature range on the low temperature side, but in the present embodiment, the first variable capacitance circuit having a positive characteristic is used as the variable capacitance circuit to which the temperature compensation voltage is supplied. Therefore, the temperature compensation voltage can be sufficiently increased at the upper limit of the operating temperature range, and appropriate temperature compensation can be implemented.

In the present embodiment, the frequency control circuit may output, as the frequency control voltage, a voltage generated by dividing a control voltage input from an outside by at least one variable resistor.

In this way, the oscillation frequency can be controlled by using the frequency control voltage without using an amplifier that has a large circuit scale, a high power consumption and much noise, and a reduction in circuit scale, a reduction in power consumption and the like can be achieved.

In the present embodiment, the frequency control circuit may include a first variable resistor provided between an input node of the control voltage and an output node of the frequency control voltage, a second variable resistor having one end coupled to the output node, a third variable resistor provided between an input node of a reference voltage and a coupling node to which the other end of the second variable resistor is coupled, and a fourth variable resistor provided between the coupling node and a low potential power supply node.

In this way, by adjusting resistance values of the first variable resistor to the fourth variable resistor, gain of the frequency control voltage with respect to the control voltage can be adjusted without using an amplifier that has a large circuit scale, a high power consumption and much noise.

In the present embodiment, an absolute value of frequency-voltage sensitivity of the first variable capacitance circuit may be higher than an absolute value of frequency-voltage sensitivity of the second variable capacitance circuit.

In this way, a frequency fluctuation range on the temperature compensation side is made wider than a frequency fluctuation range on the frequency control side, and appropriate temperature compensation can be implemented.

An oscillator according to the present embodiment includes a resonator and a circuit device. The circuit device includes: an oscillation circuit configured to oscillate the resonator; a temperature compensation circuit configured to output a temperature compensation voltage for temperature compensating an oscillation frequency of the oscillation circuit, based on a temperature detection result of a temperature sensor; and a frequency control circuit configured to output a frequency control voltage for the oscillation frequency. The oscillation circuit includes a first variable capacitance circuit whose capacitance change characteristic with respect to a capacitance control voltage is a positive characteristic, and a second variable capacitance circuit whose capacitance change characteristic with respect to the capacitance control voltage is a negative characteristic. The temperature compensation circuit supplies the temperature compensation voltage as the capacitance control voltage to the first variable capacitance circuit, and the frequency control circuit supplies the frequency control voltage as the capacitance control voltage to the second variable capacitance circuit.

Although the present embodiment has been described in detail above, it will be easily understood by those skilled in the art that many modifications can be made without substantially departing from the novel matters and effects of the present disclosure. Therefore, all such modifications are intended to be included within the scope of the present disclosure. For example, a term cited with a different term having a broader meaning or the same meaning at least once in the specification or in the drawings can be replaced with the different term at any place in the specification or in the drawings. In addition, all combinations of the present embodiment and the modifications are also included in the scope of the present disclosure. The configurations, operations, and the like of the circuit device and the oscillator are not limited to those described in the present embodiment, and various modifications can be made.

What is claimed is:

1. A circuit device, comprising:
an oscillation circuit configured to oscillate a resonator;
a temperature compensation circuit configured to output a temperature compensation voltage for temperature compensating an oscillation frequency of the oscillation circuit, based on a temperature detection result of a temperature sensor; and
a frequency control circuit configured to output a frequency control voltage for the oscillation frequency, wherein
the oscillation circuit includes
a first variable capacitance circuit whose capacitance change characteristic with respect to a capacitance control voltage is a positive characteristic, and
a second variable capacitance circuit whose capacitance change characteristic with respect to the capacitance control voltage is a negative characteristic,
the temperature compensation circuit supplies the temperature compensation voltage as the capacitance control voltage to the first variable capacitance circuit, and
the frequency control circuit supplies the frequency control voltage as the capacitance control voltage to the second variable capacitance circuit.

2. The circuit device according to claim 1, wherein
the temperature compensation circuit includes an amplifier circuit for a class A operation configured to output the temperature compensation voltage.

3. The circuit device according to claim 2, wherein
the temperature compensation circuit includes
a current generation circuit configured to generate a function current based on the temperature detection result of the temperature sensor, and
a current-voltage conversion circuit configured to convert the function current into a voltage and output the temperature compensation voltage by the amplifier circuit for a class A operation.

4. The circuit device according to claim 1, wherein
the resonator has a frequency-temperature characteristic approximated by a cubic curve, and
the resonator is a resonator in which the oscillation frequency at an upper limit of an operating temperature range is larger than a local maximum value of the oscillation frequency in a state where temperature compensation is not performed.

5. The circuit device according to claim 1, wherein
the frequency control circuit outputs, as the frequency control voltage, a voltage generated by dividing a control voltage input from an outside by at least one variable resistor.

6. The circuit device according to claim 5, wherein
the frequency control circuit includes
a first variable resistor provided between an input node of the control voltage and an output node of the frequency control voltage,
a second variable resistor having one end coupled to the output node,
a third variable resistor provided between an input node of a reference voltage and a coupling node to which the other end of the second variable resistor is coupled, and
a fourth variable resistor provided between the coupling node and a low potential power supply node.

7. The circuit device according to claim 1, wherein
an absolute value of frequency-voltage sensitivity of the first variable capacitance circuit is higher than an absolute value of frequency-voltage sensitivity of the second variable capacitance circuit.

8. An oscillator, comprising:
a resonator; and
a circuit device, wherein
the circuit device includes
an oscillation circuit configured to oscillate the resonator,
a temperature compensation circuit configured to output a temperature compensation voltage for temperature compensating an oscillation frequency of the oscillation circuit, based on a temperature detection result of a temperature sensor, and
a frequency control circuit configured to output a frequency control voltage for the oscillation frequency,
the oscillation circuit includes
a first variable capacitance circuit whose capacitance change characteristic with respect to a capacitance control voltage is a positive characteristic, and
a second variable capacitance circuit whose capacitance change characteristic with respect to the capacitance control voltage is a negative characteristic,
the temperature compensation circuit supplies the temperature compensation voltage as the capacitance control voltage to the first variable capacitance circuit, and
the frequency control circuit supplies the frequency control voltage as the capacitance control voltage to the second variable capacitance circuit.

9. The oscillator according to claim 8, wherein
the temperature compensation circuit includes an amplifier circuit for a class A operation configured to output the temperature compensation voltage.

10. The oscillator according to claim 8, wherein
the resonator has a frequency-temperature characteristic approximated by using a cubic curve, and
the resonator is a resonator in which the oscillation frequency at an upper limit of an operating temperature range is larger than a local maximum value of the oscillation frequency in a state where temperature compensation is not performed.

* * * * *